US012501820B2

(12) United States Patent
Shi et al.

(10) Patent No.: US 12,501,820 B2
(45) Date of Patent: Dec. 16, 2025

(54) DISPLAY SUBSTRATE AND PREPARATION METHOD THEREFOR, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Bo Shi, Beijing (CN); Weiyun Huang, Beijing (CN); Wei Zhang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 699 days.

(21) Appl. No.: 17/768,223

(22) PCT Filed: Jun. 10, 2021

(86) PCT No.: PCT/CN2021/099458
§ 371 (c)(1),
(2) Date: Apr. 12, 2022

(87) PCT Pub. No.: WO2022/012235
PCT Pub. Date: Jan. 20, 2022

(65) Prior Publication Data
US 2024/0114763 A1    Apr. 4, 2024

(30) Foreign Application Priority Data

Jul. 14, 2020 (CN) .......................... 202010677850.0

(51) Int. Cl.
*H10K 77/10* (2023.01)
*H10K 59/38* (2023.01)
(Continued)

(52) U.S. Cl.
CPC .......... *H10K 77/111* (2023.02); *H10K 59/38* (2023.02); *H10K 59/60* (2023.02);
(Continued)

(58) Field of Classification Search
None
See application file for complete search history.

(56) References Cited

U.S. PATENT DOCUMENTS

2011/0310336 A1* 12/2011 Kobayashi .......... G02F 1/13394
349/155
2022/0052117 A1   2/2022 Sun et al.

FOREIGN PATENT DOCUMENTS

CN      110021644 A    7/2019
CN      111162109 A    5/2020
(Continued)

OTHER PUBLICATIONS

International Search Report for PCT/CN2021/099458 Mailed Aug. 27, 2021.
(Continued)

*Primary Examiner* — Sarah K Salerno
(74) *Attorney, Agent, or Firm* — Ling Wu; Stephen Yang; Ling and Yang Intellectual Property

(57) ABSTRACT

A display substrate, including: a flexible base substrate, a display structure layer, and a color filter layer. The flexible base substrate comprises: a first display region. The first display region comprises: at least one sub-display region and at least one light-transmissive region. The display structure layer comprises a plurality of first light-emitting units disposed on a flexible base substrate of the sub-display region. The color filter layer is arranged on a light exit side of the display structure layer and the at least one light-transmissive region. A color filter layer of the at least one light-transmissive region comprises a plurality of blue filter units, or a
(Continued)

color filter layer of the at least one light-transmissive region includes: first red filter units, first green filter units, and first blue filter units which are periodically arranged.

12 Claims, 14 Drawing Sheets

(51) Int. Cl.
  *H10K 59/60* (2023.01)
  *H10K 59/80* (2023.01)
  *H10K 71/00* (2023.01)
  *H10K 102/00* (2023.01)
(52) U.S. Cl.
  CPC ......... *H10K 59/8792* (2023.02); *H10K 71/00* (2023.02); *H10K 2102/351* (2023.02)

(56) References Cited

FOREIGN PATENT DOCUMENTS

| CN | 210628315 U | 5/2020 | |
|---|---|---|---|
| CN | 111799311 A | 10/2020 | |
| JP | 2009-145657 A | 7/2009 | |
| KR | 20220051619 A | * 4/2022 | ........... G09G 3/3275 |

OTHER PUBLICATIONS

Office Action dated Oct. 11, 2021 for Chinese Patent Application No. 202010677850.0 and English Translation.

* cited by examiner

DISPLAY SUBSTRATE AND PREPARATION METHOD THEREFOR, AND DISPLAY DEVICE

CROSS-REFERENCE TO RELATED APPLICATIONS

The present application is a U.S. National Phase Entry of International Application No. PCT/CN2021/099458 having an international filing date of Jun. 10, 2021, which claims priority to Chinese Patent Application No. 202010677850.0 entitled "Display Substrate and Preparation Method Therefor, and Display Device" and filed on Jul. 14, 2020. The above-identified applications are hereby incorporated by reference.

TECHNICAL FIELD

Embodiments of the present disclosure relate to, but are not limited to, the field of display technology, in particular to a display substrate and a preparation method therefor, and a display device.

BACKGROUND

An Organic light-emitting Diode (OLED) is an active light emitting display device, and has advantages such as self-luminescence, wide view, high contrast, low power consumption, extremely high response speed, etc. With the continuous development of display technology, a display apparatus using an OLED as a light-emitting device and a Thin Film Transistor (TFT) for signal control has become a mainstream product in the field of display at present.

SUMMARY

The following is a summary of subject matters described herein in detail. The summary is not intended to limit the scope of protection of claims.

The present disclosure provides a display substrate and a preparation method therefor, and a display apparatus.

According to a first aspect, an embodiment of the present disclosure provides a display substrate, which includes a flexible substrate, a display structure layer, and a color filter layer. The flexible substrate includes a first display region, which includes at least one sub-display region and at least one light-transmissive region. The display structure layer includes a plurality of first light-emitting units disposed on a flexible substrate of the at least one sub-display region. The color filter layer is disposed on a light exit side of the display structure layer and at least one light-transmissive region. The color filter layer of the at least one light-transmissive region includes a plurality of blue filter units; or, the color filter layer of the at least one light-transmissive region includes first red filter units, first green filter units, and first blue filter units which are periodically arranged, wherein the total area of the first blue filter units is greater than that of the first red filter units, and the total area of the first blue filter units is greater than that of the first green filter units.

According to another aspect, an embodiment of the present disclosure provides a display device, which includes the aforementioned mentioned display substrate and a photosensitive element located on the light exit side of the display structure layer away from the display substrate, wherein an orthographic projection of the photosensitive element on the display substrate is overlapped with the first display region.

According to another aspect, an embodiment of the present disclosure provides a method for preparing a display substrate, including: providing a flexible substrate including a first display region, wherein the first display region includes at least one sub-display region and at least one light-transmissive region; forming a display structure layer on the flexible substrate; and forming a color filter layer on a light exit side of the display structure layer and the at least one light-transmissive region. The display structure layer includes a plurality of first light-emitting units disposed in the at least one sub-display region. The color filter layer of the at least one light-transmissive region includes a plurality of blue filter units; or, the color filter layer of the at least one light-transmissive region includes first red filter units, first green filter units, and first blue filter units which are periodically arranged, wherein the total area of the first blue filter units is greater than that of the first red filter units, and the total area of the first blue filter units is greater than that of the first green filter units.

Other aspects may be understood upon reading and understanding of the accompanying drawings and detailed descriptions.

BRIEF DESCRIPTION OF DRAWINGS

Accompanying drawings are used to provide an understanding of technical solutions of the present disclosure, form a part of the specification, and are used to explain the technical solutions of the present disclosure together with the embodiments of the present disclosure and not intended to form limitations on the technical solutions of the present disclosure.

DETAILED DESCRIPTION

Figure 1:
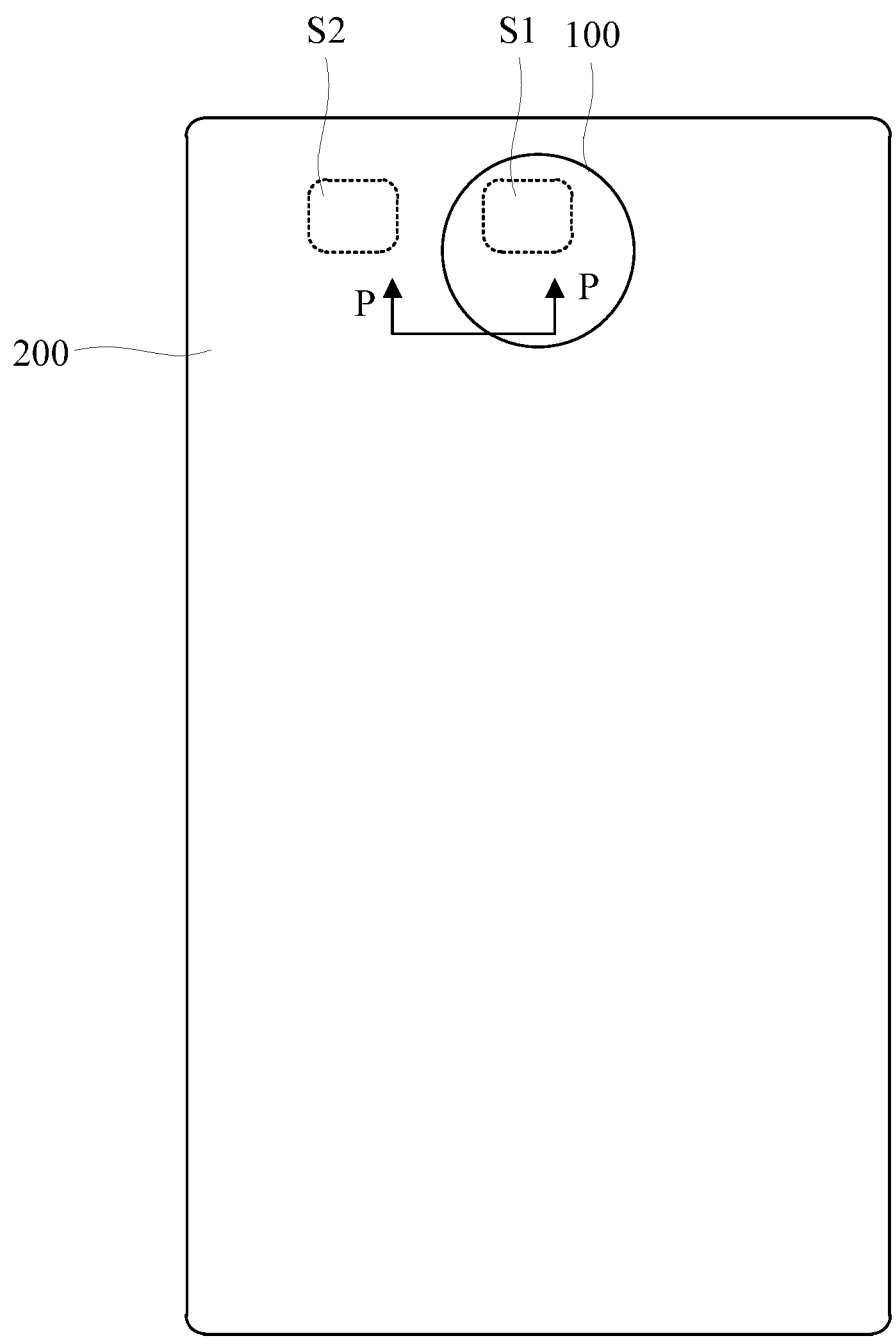
FIG. 1 is a schematic diagram of a structure of a display substrate according to at least one embodiment of the present disclosure.

A plurality of embodiments are described in the present disclosure. However, the description is exemplary and unrestrictive. Moreover, it is apparent to those of ordinary skills in the art that there may be more embodiments and implementation solutions in the scope of the embodiments described in the present disclosure. Although many possible feature combinations are shown in the drawings and discussed in the implementations, disclosed features may alternatively be combined in many other manners. Unless expressly limited, any feature or element of any embodiment may be used in combination with, or may be used to replace, any other feature or element in any other embodiment.

The present disclosure includes and conceives combinations with the features and elements known to those of ordinary skills in the art. The embodiments, features, and elements disclosed in the present disclosure may alternatively be combined with any conventional feature or element to form a unique solution defined by the claims. Any feature or element of any embodiment may alternatively be combined with a feature or an element from another solution to form another unique solution defined by the claims. Therefore, it should be understood that any feature shown or discussed in the present disclosure may be implemented independently or in any appropriate combination. Therefore, the embodiments are not to be limited except the limitation by the appended claims and their equivalents. In addition, one or more modifications and alterations may be made within the protection scope of the appended claims.

In addition, when a representative embodiment is described, a method or a process may already be presented as a specific order of steps in the specification. However, the method or the process should not be limited to the steps with the specific order on the premise that the method or the process is independent of the specific order of the steps described herein. Those of ordinary skills in the art will understand that other orders of steps may also be possible. Therefore, the specific order of the steps illustrated in the specification should not be interpreted as a limitation on claims. In addition, the claims with respect to the method or process should not be limited to execute their steps according to the written sequence. Those skilled in the art may easily understand that these sequences may change, and are still maintained in the spirit and scope of the embodiments of the disclosure.

In the accompanying drawings, the size of a constituent element, and the thickness of a layer or an area are sometimes exaggerated for clarity. Therefore, an implementation of the present disclosure is not necessarily limited to the size shown, and a shape and size of each component in the drawings do not reflect true proportions. In addition, the accompanying drawings schematically show ideal examples, and one mode of the present disclosure is not limited to a shape, a numerical value, or the like shown in the accompanying drawings.

Unless otherwise defined, technical terms or scientific terms used in the present disclosure have the same meanings as commonly understood by those of ordinary skills in the art to which the present disclosure belongs. The "first," "second," and similar terms used in the present disclosure do not indicate any order, number, or importance, but are used only for distinguishing different components. In the present disclosure, "a plurality of" a plurality of may refer to two or more than two. "Include" or "contain" and similar terms mean that an element or object appearing before the term includes the elements or objects listed after the term and their equivalents, and other components or objects are not excluded. Similar terms such as "couple", "connect" or "link" are not limited to physical or mechanical connections, but may include electrical connections, whether direct or indirect. "Electrical connection" includes a case where constituent elements are connected together through an element with a certain electrical action. There is no specific restriction on the "element having some electrical function" as long as it may transmit and receive electrical signals between connected constituent elements. Examples of "the element with the certain electrical action" not only include electrodes and wirings, but also include switching elements such as transistors, resistors, inductors, capacitors, and other elements with one or more functions.

In the present disclosure, a transistor refers to an element at least including three terminals, i.e., a gate electrode, a drain electrode, and a source electrode. The transistor has a channel region between the drain electrode (drain electrode terminal, drain region, or drain electrode) and the source electrode (source electrode terminal, source region, or source electrode), and a current may flow through the drain electrode, the channel region and the source electrode. In the present disclosure, the channel region refers to a region through which the current mainly flows.

In the present disclosure, a first electrode is a drain electrode, and a second electrode is a source electrode. Alternatively, a first electrode is a source electrode, and a second electrode is a drain electrode. In the case that transistors with opposite polarities are used, or that a direction of a current changes during operation of a circuit, or the like, functions of the "source electrode" and the "drain electrode" are sometimes exchanged. Therefore, the "source electrode" and the "drain electrode" are interchangeable in the present disclosure.

In the present disclosure, "parallel" refers to a state in which an angle formed by two straight lines is above −10° and below 10°, and thus may include a state in which the angle is above −5° and below 5°. In addition, "perpendicular" refers to a state that an angle formed by two straight lines is above 80° and below 100°, and thus may include a state that the angle is above 85° and below 95°.

In the present disclosure, "film" and "layer" are interchangeable. For example, sometimes a "conducting layer" may be replaced with a "conducting film". Similarly, sometimes an "insulating film" may be replaced with an "insulating layer".

In the present disclosure, "about" refers to that a boundary is defined not so strictly and numerical values in process and measurement error ranges are allowed.

In order to keep the following description of the embodiments of the present disclosure clear and concise, detailed descriptions about part of known functions and known components are omitted in the present disclosure. The drawings of the embodiments of the present disclosure only involve the structures involved in the embodiments of the present disclosure, and other structures may refer to conventional designs.

At present, flexible OLED display substrates are often made of flexible substrates of polyimide (PI) materials. The flexible substrate made of PI material is yellow and absorbs more blue light. Because of the blue light absorption characteristics of the substrate prepared by PI material, in the off-screen camera solution with the application of flexible OLED display substrate, the incident light is yellow when entering the off-screen camera device through the flexible OLED display substrate, and the blue light accounts for a low proportion of light intensity of red light, green light and blue light among the light entering the off-screen camera device, which affects the white balance during camera shooting, leads to yellow imaging and affects the imaging quality.

At least one embodiment of the present disclosure provides a display substrate, including a flexible substrate, a display structure layer, and a color filter layer. The flexible substrate includes a first display region. The first display region includes at least one sub-display region and at least one light-transmissive region. The display structure layer includes a plurality of first light-emitting units, the plurality of the first light-emitting units are disposed on the flexible substrate of the at least one sub-display region. The color filter layer is disposed on a light exit side of the display structure layer and the at least one light-transmissive region. The color filter layer of the at least one light-transmissive region includes a plurality of blue filter units; or, the color filter layer of the at least one light-transmissive region includes first red filter units, first green filter units, and first blue filter units which are periodically arranged, wherein the total area of the first blue filter units is greater than that of the first red filter units, and the total area of the first blue filter units is greater than that of the first green filter units.

In some examples, the first display region may include a sub-display region and a light-transmissive region, for example, the sub-display region may surround the light-transmissive region. Alternatively, the first display region may include a plurality of sub-display regions spaced apart from each other and light-transmissive regions located between adjacent sub-display regions. Alternatively, the first display region may include a plurality of light-transmissive regions spaced apart from each other and sub-display regions located between adjacent light-transmissive regions. Alternatively, the first display region may include a first region including a plurality of sub-display regions spaced apart from each other and light-transmissive regions located between adjacent sub-display regions, and a second region including a plurality of light-transmissive regions spaced apart from each other and sub-display regions located between adjacent light-transmissive regions. However, this embodiment is not limited thereto.

In some examples, when the first display region includes a light-transmissive region or a plurality of light-transmissive regions spaced apart from each other, the color filter layer of each light-transmissive region may only include a plurality of blue filter units, or it may include first red filter units, first green filter units, and first blue filter units which are periodically arranged, wherein the total area of the first blue filter units is greater than the total area of the first red filter units and the total area of first green filter units. In some examples, when the first display region includes a plurality of light-transmissive regions spaced apart from each other, the color filter layer of a part of the light-transmissive regions in the plurality of light-transmissive regions may only include a plurality of blue filter units, and the color filter layer of the other part of the light-transmissive regions may include first red filter units, first green filter units, and first blue filter units which are periodically arranged, wherein the total area of the first blue filter units is greater than the total area of the first red filter units and the total area of first green filter units. However, this embodiment is not limited thereto.

In some examples, when the color filter layer of the light-transmissive region includes a plurality of blue filter units, the shapes of the plurality of blue filter units may be the same, for example, all of them are rectangular or hexagonal, or the shapes of the plurality of blue filter units may be partially the same, or the shapes of the plurality of blue filter units may all be different. However, this embodiment is not limited thereto. In addition, in the present embodiment, the positions of the plurality of blue filter units in the light-transmissive region are not limited.

In some examples, when the color filter layer of the light-transmissive region includes a first red filter unit, a first green filter unit and a first blue filter unit arranged periodically, the shapes of the first red filter unit, the first green filter unit and the first blue filter unit may be identical, for example, all of them are rectangular or hexagonal, or partially identical, or all different. When a first red filter unit, a first green filter unit and a first blue filter unit are arranged for a plurality of periods in the light-transmissive region, the shapes of the plurality of first red filter units may be identical, or partially identical, or all different, the shapes of the plurality of first green filter units may be identical, or partially identical, or all different, and the shapes of the plurality of first blue filter units may be identical, or partially identical, or all different. However, this embodiment is not limited thereto. In addition, the present embodiment does not limit the arrangements of the first red filter unit, the first green filter unit and the first blue filter unit in each period. In addition, the present embodiment does not limit the quantities of the first red filter unit, the first green filter unit and the first blue filter unit in each period. For example, the quantities of the first blue filter unit, the first red filter unit, and the first green filter unit may each be one in each period. Alternatively, the quantity of the first red filter unit and the first green filter unit is one, and the quantity of the first blue filter unit is two.

In the present disclosure, "area" refers to the size of an orthographic projection on the flexible substrate.

In the present disclosure, the filter unit can transmit light of a single color and absorb light of other colors. For example, a blue filter unit can let blue light pass through and absorb light of other colors.

The display substrate according to the embodiment provides a plurality of blue filter units in the color filter layer of the light transmission region of the first display region. Alternatively, a first red filter unit, a first green filter unit and a first blue filter unit are periodically arranged periodically, and the total area of the first blue filter unit is larger than the total area of the first red filter unit and the total area of the first green filter unit, so as to adjust the light color of the photosensitive element underneath the first display region, and balance the influence of the flexible substrate on the incident light, thereby optimizing the white balance and improving the imaging quality of the photosensitive element.

In some exemplary embodiments, the thickness of a filter unit of the color filter layer ranges from about 0.1 micrometers (um) to about 2 micrometers. That is, the thickness of the filter unit of the color filter layer may be greater than or equal to about 0.1 microns and less than or equal to about 2 microns. In some examples, the thickness of the filter units of different colors of the color filter layer is the same and the thickness of the filter units of the color filter layer may be about 0.5 microns. However, this embodiment is not limited thereto.

In the present disclosure, "thickness" refers to a height from a surface close to the flexible substrate to a surface away from the flexible substrate in a direction of a plane perpendicular to the flexible substrate.

In some exemplary embodiments, when the color filter layer of the at least one light-transmissive region includes a plurality of blue filter units, the proportion of the total area of the plurality of blue filter units in the at least one light-transmissive region ranges from 10% to 50%. That is, the proportion of the total area of the plurality of blue filter units in the at least one light-transmissive region in the total area of the at least one light-transmissive region may be greater than or equal to 10%, and less than or equal to 50%. In some examples, the proportion of the total area of the plurality of blue filter units in the at least one light-transmissive region in the total area of the at least one light-transmissive region may be 28.6%. However, this embodiment is not limited thereto.

In some exemplary embodiments, when the color filter layer of the at least one light-transmissive region includes first red filter units, first green filter units, and first blue filter units which are periodically arranged, the total area of the first blue filter units is greater than the sum of the total area of the first green filter units and the total area of the first red filter units. For example, within the at least one light-transmissive region, the area of a single first blue filter unit is larger than the sum of the areas of a single first green filter unit and a single first red filter unit, and the total area of all first blue filter units is larger than the sum of the total areas of all the first green filter units and the total areas of all first red filter units.

In some exemplary embodiments, when the color filter layer of the at least one light-transmissive region includes first red filter units, first green filter units, and first blue filter units which are periodically arranged, the proportion of the total area of the first blue filter units in the at least one light-transmissive region ranges from 45% to 60%, the proportion of the total area of the first red filter units in the at least one light-transmissive region ranges from 10% to 25%, and the proportion of the total area of the first green filter units in the at least one light-transmissive region ranges from 18% to 33%. That is, the proportion of the total area of the first blue filter units in the at least one light-transmissive region in the total area of the at least one light-transmissive region may be greater than or equal to 45%, and less than or equal to 60%; the proportion of the total area of the first red filter units in the at least one light-transmissive region in the total area of the at least one light-transmissive region may be greater than or equal to 10%, and less than or equal to 25%; and the proportion of the total area of the first green filter units in the at least one light-transmissive region in the total area of the at least one light-transmissive region may be greater than or equal to 18%, and less than or equal to 33%. In some examples, the proportion of the total area of the first blue filter units in the at least one light-transmissive region in the total area of the at least one light-transmissive region may be 54%; the proportion of the total area of the first red filter units in the at least one light-transmissive region in the total area of the at least one light-transmissive region may be 19%; and the proportion of the total area of the first green filter units in the at least one light-transmissive region in the total area of the at least one light-transmissive region may be 27%. However, this embodiment is not limited thereto.

In some exemplary embodiments, the color filter layer of the at least one sub-display region includes a plurality of periodically arranged first filter units that transmit light of different colors. The color of light transmitted by any of the first filter units is the same as the color of light emitted by the first light-emitting units overlapped with the first filter units in a direction perpendicular to the flexible substrate. In other words, an orthographic projection of the first filter unit on the flexible substrate is overlapped with an orthographic projection of the first light-emitting unit on the flexible substrate, and the color of the light transmitted by the first filter unit is the same as the color of the light emitted by the first light-emitting unit. In some examples, a plurality of first filter units transmitting light of different colors correspond one-to-one with a plurality of first light-emitting units, and the color of light transmitted by each first filter unit is the same as the color of light emitted by the corresponding first light-emitting unit. In some examples, the plurality of first light-emitting units may include a blue light-emitting unit, a red light-emitting unit and a green light-emitting unit; the plurality of first filter units transmitting light rays of different colors may include a blue filter unit, a red filter unit, and a green filter unit. However, this embodiment is not limited thereto. For example, the display structure layer of the sub-display region may further include a yellow light-emitting unit, or a light-emitting unit of another color. Correspondingly, the color filter layer of the sub-display region may further include a yellow filter unit, or a filter unit of another color.

In some exemplary embodiments, the plurality of first filter units that transmit light of different colors in the at least one sub-display region may include a second red filter unit, a second green filter unit, and a second blue filter unit. When the color filter layer of the at least one light-transmissive region includes first red filter units, first green filter units, and first blue filter units which are periodically arranged, the area of a single first blue filter unit of the at least one light-transmissive region is larger than the area of a single second blue filter unit of the at least one sub-display region, the area of a single first red filter unit of the at least one light-transmissive region is smaller than the area of a single second red filter unit of the at least one sub-display region, and the area of a single first green filter unit of the at least one light-transmissive region is smaller than the area of a single second green filter unit of the at least one sub-display region. In other words, the area of any first blue filter unit in the light-transmissive region is larger than that of any second blue filter unit in the sub-display region, the area of any first red filter unit in the light-transmissive region is smaller than that of any second red filter unit in the sub-display region, and the area of any first green filter unit in the light-transmissive region is smaller than that of any second green filter unit in the sub-display region. However, this embodiment is not limited thereto. In some examples, the area of a single first blue filter unit of the at least one light-transmissive region is larger than or equal to the area of a single second blue filter unit of the at least one sub-display region, the area of a single first red filter unit of the at least one light-transmissive region is equal to the area of a single second red filter unit of the at least one sub-display region, and the area of a single first green filter unit of the at least one light-transmissive region is smaller than the area of a single second green filter unit of the at least one sub-display region. Or, in some examples, the area of a single first blue filter unit of the at least one light-transmissive region is larger than or equal to the area of a single second blue filter unit of the at least one sub-display region, the area of a single first red filter unit of the at least one light-transmissive region is smaller than the area of a single second red filter unit of the at least one sub-display region, and the area of a single first green filter unit of the at least one light-transmissive region is equal to the area of a single second green filter unit of the at least one sub-display region.

In some exemplary embodiments, the arrangement of the first red filter unit, the first green filter unit and the first blue filter unit in the at least one light-transmissive region is the same as the arrangement of the second red filter unit, the second green filter unit and the second blue filter unit in the at least one sub-display region. However, this embodiment is not limited thereto. For example, the arrangement of the first red filter unit, the first green filter unit and the first blue filter unit in the at least one light-transmissive region may be different from the arrangement of the second red filter unit, the second green filter unit and the second blue filter unit in the at least one sub-display region.

In some exemplary embodiments, when the plurality of first filter units that transmit light of different colors in the at least one sub-display region include a second red filter unit, a second green filter unit, and a second blue filter unit, the color filter layer of the at least one light-transmissive region includes a plurality of blue filter units; the area of each blue filter unit of the at least one light-transmissive region may be equal to the area of each second blue filter unit of the at least one sub-display region, and the arrangement of the plurality of blue filter units is the same as the arrangement of the plurality of second blue filter units in the at least one sub-display region. However, this embodiment is not limited thereto. For example, the area of a single blue filter unit may be larger or smaller than the area of a single second blue filter unit. In some examples, the shape of each blue filter unit of the at least one light-transmissive region may be the same as the shape of the second blue filter unit of the at least one sub-display region, for example, both are hexagonal. However, this embodiment is not limited thereto.

In some exemplary embodiments, a color filter layer and a display structure layer are disposed on the same side of a flexible substrate; alternatively, the display structure layer is disposed on one side of the flexible substrate, and the color filter layer is disposed on the other side of the flexible substrate. In some examples, the display substrate may be a top emission structure, the color filter layer is disposed on a side of the display structure layer away from the flexible substrate. Alternatively, in some examples, the display substrate may be a bottom emission structure, the display structure layer is disposed on a side of the flexible substrate, and the color filter layer is disposed on the other side of the flexible substrate.

In some exemplary embodiments, the flexible substrate includes a first display region and a second display region. The Pixels Per Inch (PPI) of the second display region is larger than the pixels per inch of the first display region. The display structure layer includes a plurality of second light-emitting units disposed on the flexible substrate in the second display region. The color filter layer of the second display region includes a plurality of second filter units periodically arranged that transmit light of different colors and a black matrix located between adjacent second filter units; The color of light transmitted by any of the second filter units is the same as the color of light emitted by the second light-emitting units overlapped with the second filter units in a direction perpendicular to the flexible substrate. In other words, an orthographic projection of the second filter unit on the flexible substrate is overlapped with an orthographic projection of the second light-emitting unit on the flexible substrate, and the color of the light transmitted by the second filter unit is the same as the color of the light emitted by the second light-emitting unit. In some examples, a plurality of second filter units transmitting light of different colors correspond one-to-one with a plurality of second light-emitting units, and the color of light transmitted by each second filter unit is the same as the color of light emitted by the corresponding second light-emitting unit. In some examples, a plurality of second light-emitting units may include a blue light-emitting unit, a red light-emitting unit and a green light-emitting unit; the plurality of second filter units of different colors may include a blue filter unit, a red filter unit, and a green filter unit. However, this embodiment is not limited thereto. For example, the display structure layer of the second display region may further include a yellow light-emitting unit, or a light-emitting unit of another color, and the color filter layer of the second display region may further include a yellow filter unit, or a light filter unit of another color.

In some examples, the arrangement of the plurality of second light-emitting units within the second display region may be the same or different from the arrangement of the plurality of first light-emitting units within the at least one sub-display region of the first display region. The arrangement of the plurality of second filter units in the second display region and the arrangement of the plurality of first filter units in the at least one sub-display region of the first display region may be the same or different.

FIG. 1 is a schematic diagram of a structure of a display substrate according to at least one embodiment of the present disclosure. As shown in FIG. 1, the display substrate of the present embodiment includes a first display region 100 and a second display region 200. Herein, the pixel density of the second display region 200 is greater than the pixel density of the first display region 100. In some examples, the display substrate may be a flexible OLED display substrate. The first display region 100 may be reserved for a photosensitive element such as a camera, and the second display region 200 may be a regular display region of the display substrate. The shape of the first Display Region 100 may be circular, elliptical, or polygonal, or any shape formed by a combination of partial segments of the above shapes. The second display region 200 may be disposed around the first display region 100 or on a side of the first display region 100, or may partially surround the first display region 100. For example in FIG. 1, the first display region 100 is circular and the second display region 200 is disposed around the first display region 100. However, this embodiment is not limited thereto.

Figure 2:
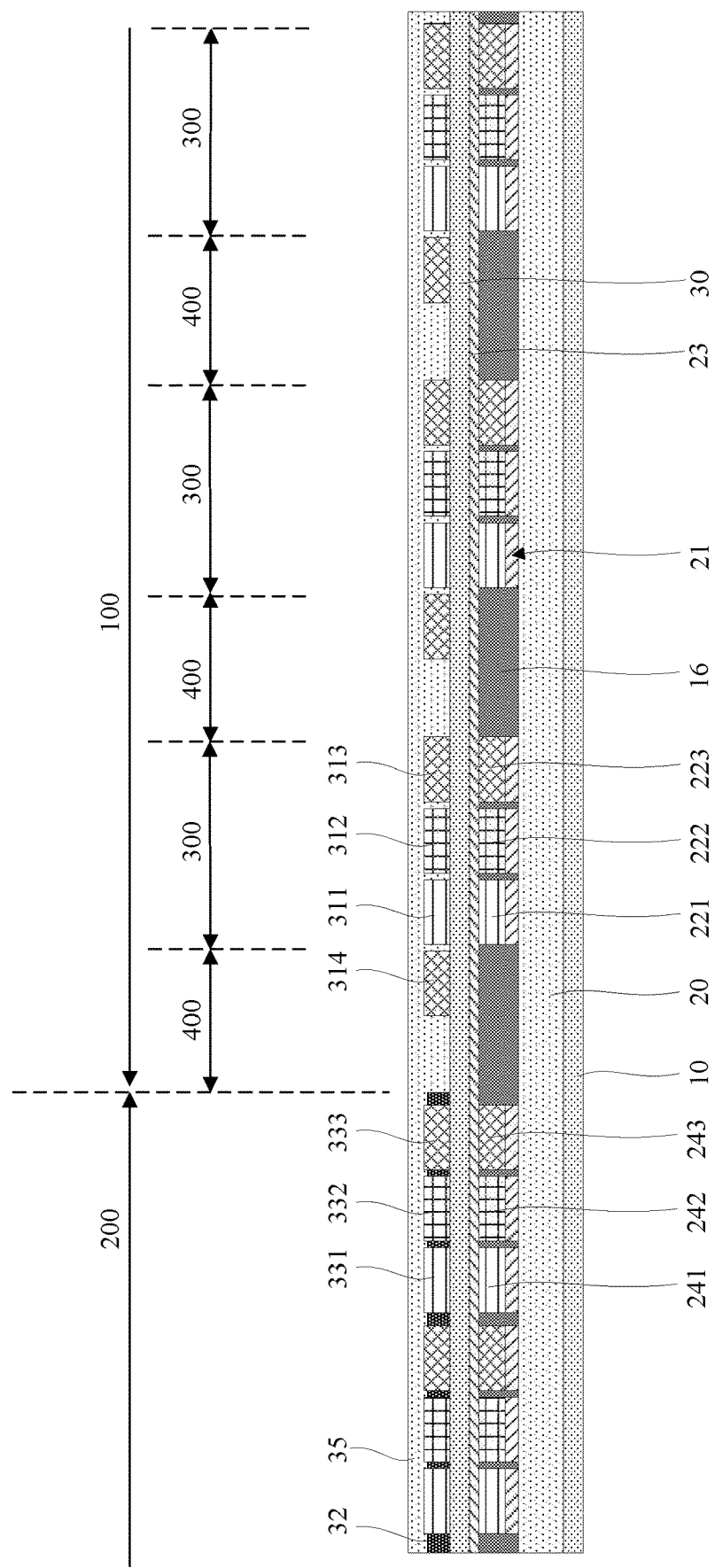
FIG. 2 is a schematic sectional view along P-P direction in FIG. 1.
Figure 3:
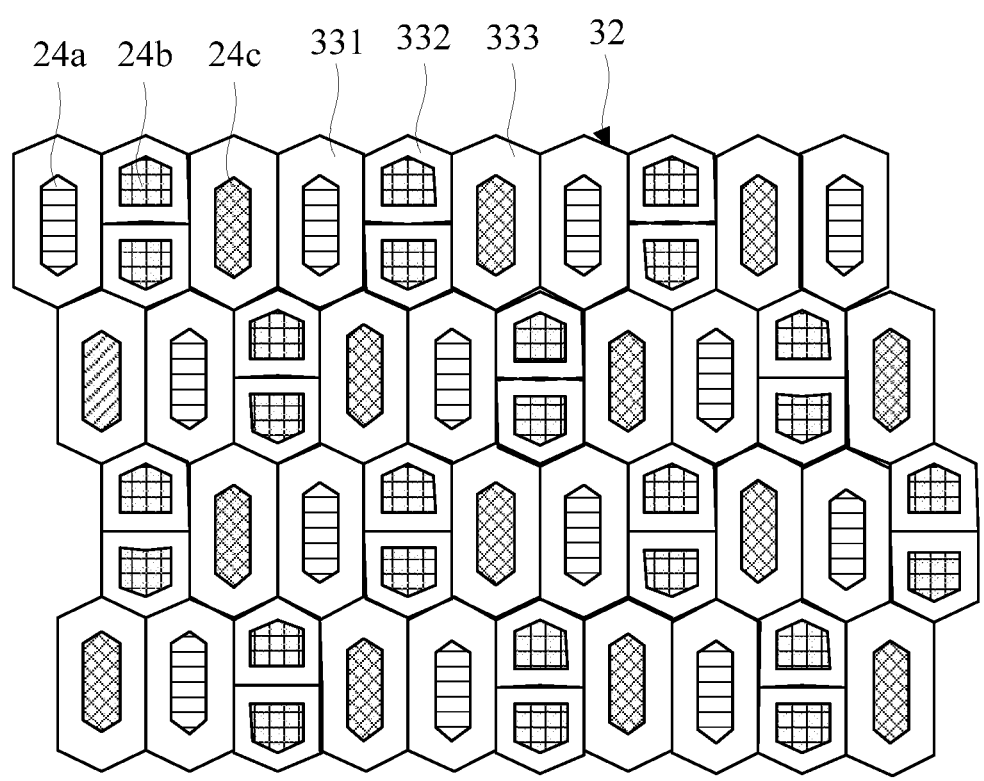
FIG. 3 is a schematic diagram of a partial structure of a second display region according to at least one embodiment of the present disclosure.

FIG. 2 is a schematic sectional view along a P-P direction in FIG. 1. FIG. 3 is a schematic diagram of a partial structure of a second display region according to at least one embodiment of the present disclosure. FIG. 3 is a schematic partial enlarged view of region S2 in FIG. 1.

In some exemplary embodiments, as shown in FIG. 3, a plurality of second light-emitting units are disposed within a second display region on a plane parallel to the display substrate. Each second light-emitting unit includes a light-emitting element and a drive circuit configured to drive the light-emitting element to emit light. In some examples, the plurality of second light-emitting units may include a first color light-emitting unit 24a, a second color light-emitting unit 24b and a third color light-emitting unit 24c. A plurality of second light-emitting units of the second display region may be arranged in the following manner: arranged according to a repeating unit including two second color light-emitting units 24b, one first color light-emitting unit 24a and one third color light-emitting unit 24c on each row, two second color light-emitting units 24b of the repeating unit are arranged in the column direction, and repeating units of two adjacent rows are misplaced, for example, with a shift of 1.5 times the width of the light-emitting units in the row direction. One pixel unit in the second display region at least includes one first color light-emitting unit 24a, two second color light-emitting units 24b, and one third color light-emitting unit 24c.

In some exemplary embodiments, as shown in FIG. 3, on a plane parallel to the display substrate, the second color light-emitting unit 24b may be pentagonal (e.g., rounded pentagonal), and two adjacent second color light-emitting units 24b are symmetrical to each other, and the symmetry axis is parallel to the row direction. The first color light-emitting unit 24a and the third color light-emitting unit 24c are hexagonal (e.g. rounded hexagonal) respectively. The widths of the first color light-emitting unit 24a, the second color light-emitting unit 24b and the third color light-emitting unit 24c may be the same along a row direction. The lengths of the first color light-emitting unit 24a and the third color light-emitting unit 24c may be the same along a column direction. The length of the second color light-emitting unit 24b in the column direction may be smaller than the lengths of the first color light-emitting unit 24a and the third color light-emitting unit 24c in the column direction. In some examples, the first color light-emitting unit 24a may be a red (R) light-emitting unit, the second color light-emitting unit 24b may be a green (G) light-emitting unit, and the third color light-emitting unit 24c may be a blue (B) light-emitting unit. However, shapes and arrangement manner of the plurality of second light-emitting units in the second display region are not limited in this embodiment. In some examples, the plurality of second light-emitting units of the second display region may include, for example, a strip-shaped red light-emitting unit, a strip-shaped green light-emitting unit and a strip-shaped blue light-emitting unit; the strip-shaped red light-emitting unit, green light-emitting unit and blue light-emitting unit may be arranged cyclically or misplaced in a triangular distribution.

In some exemplary embodiments, as shown in FIG. 3, a plurality of second filter units are disposed within a second display region on a plane parallel to the display substrate. The plurality of second filter units include a first color filter unit 331, a second color filter unit 332, and a third color filter unit 333. A black matrix 32 is provided between adjacent filter units. In some examples, the first color filter unit 331 is a red filter unit, the second color filter unit 332 is a green filter unit, and the third color filter unit 333 is a blue filter unit. The arrangement of the plurality of second filter units is the same as that of the plurality of second light-emitting units. In some examples, the plurality of second filter units may be in one-to-one correspondence with the plurality of second light-emitting units. The shape and position of the first color filter unit 331 may correspond to the first color light-emitting unit 24a, the shape and position of the second color filter unit 332 may correspond to the second color light-emitting unit 24b, and the shape and position of the third color filter unit 333 may correspond to the third color light-emitting unit 24c. For example, the first color filter unit 331 and the third color filter unit 333 may be hexagonal (e.g. rounded hexagon) and the second color filter unit 332 may be pentagonal (e.g. rounded pentagon). However, this embodiment is not limited thereto. In some examples, The shape and position of the first color filter unit may correspond to the first color light-emitting unit 24a, the shape and position of the second color filter unit may correspond to two adjacent second color light-emitting units 24b, and the shape and position of the third color filter unit may correspond to the third color light-emitting unit 24c. For example, the first color filter unit, the second color filter unit, and the third color filter unit may all be hexagonal.

In some exemplary embodiments, as shown in FIG. 2, in a direction perpendicular to the display substrate, the second display region includes: a flexible substrate 10, a display structure layer disposed on the flexible substrate 10, the thin film encapsulation layer 30 disposed on a side of the display structure layer away from the flexible substrate 10, and a color filter layer disposed on a side of thin film encapsulation layer 30 away from the flexible substrate 10. The display structure layer includes a driving structure layer 20 and a light-emitting structure layer located at a side of the driving structure layer 20 away from the flexible substrate 10. The drive structure layer 20 includes a plurality of drive circuits and the light-emitting structure layer includes a plurality of light-emitting elements. The drive circuits are in one-to-one correspondence to the light-emitting elements, and each drive circuit is configured to drive the corresponding light-emitting element to emit light. Each drive circuit may include a plurality of transistors and at least one storage capacitor, such as a 2T1C, 3T1C, or 7T1C design.

In some exemplary embodiments, as shown in FIG. 2, On a plane perpendicular to the display substrate, Each light-emitting element may include a first electrode layer 21, an organic emitting layer (e.g., a first color organic emitting layer 241, a second color organic emitting layer 242, or a third color organic emitting layer 243) located on a side of the first electrode layer 21 away from the flexible substrate 10, and a second electrode 23 located on a side of the organic emitting layer away from the flexible substrate 10. The first electrode layer 21 may include a reflective anode such as a first light-transmissive conductive layer, a reflective layer on the first light-transmissive conductive layer, and a second light-transmissive conductive layer on the reflective layer. The first light-transmissive conductive layer and the second light-transmissive conductive layer may be made of a light-transmissive conductive material such as Indium Tin Oxide (ITO) or Indium Zinc Oxide (IZO). The reflective layer may be a metal layer, for example, made of silver. The organic emitting layer may include an OLED Emitting Layer (EML). In some examples, the organic emitting layer may further include at least one of a hole injection layer, a hole transport layer, an electron injection layer and an electron transport layer. The second electrode 23 may be a light-transmissive cathode. In some examples, the second electrode 23 may be made of a light-transmissive conductive material such as ITO or IZO.

In some exemplary embodiments, as shown in FIG. 2, on a plane perpendicular to the display substrate, the color filter layer of the second display region 200 includes a plurality of second filter units (e.g., a first color filter unit 331, a second color filter unit 332, and a third color filter unit 333) and a black matrix 32 disposed between adjacent second filter units. The light exit direction of the second light-emitting unit of the second display region 200 faces the second filter unit. An orthographic projection of a first color filter unit 331 on the flexible substrate 10 is overlapped with an orthographic projection of the first color organic emitting layer 241 on the flexible substrate 10, an orthographic projection of a second color filter unit 332 on the flexible substrate 10 is overlapped with an orthographic projection of the second color organic emitting layer 242 on the flexible substrate 10, and an orthographic projection of the third color filter unit 333 on the flexible substrate 10 is overlapped with an orthographic projection of the third color organic emitting layer 243 on the flexible substrate 10. The color filter layer of the second display region 200 is covered with a light-transmissive Over Coat (OC) layer 35.

Figure 4:
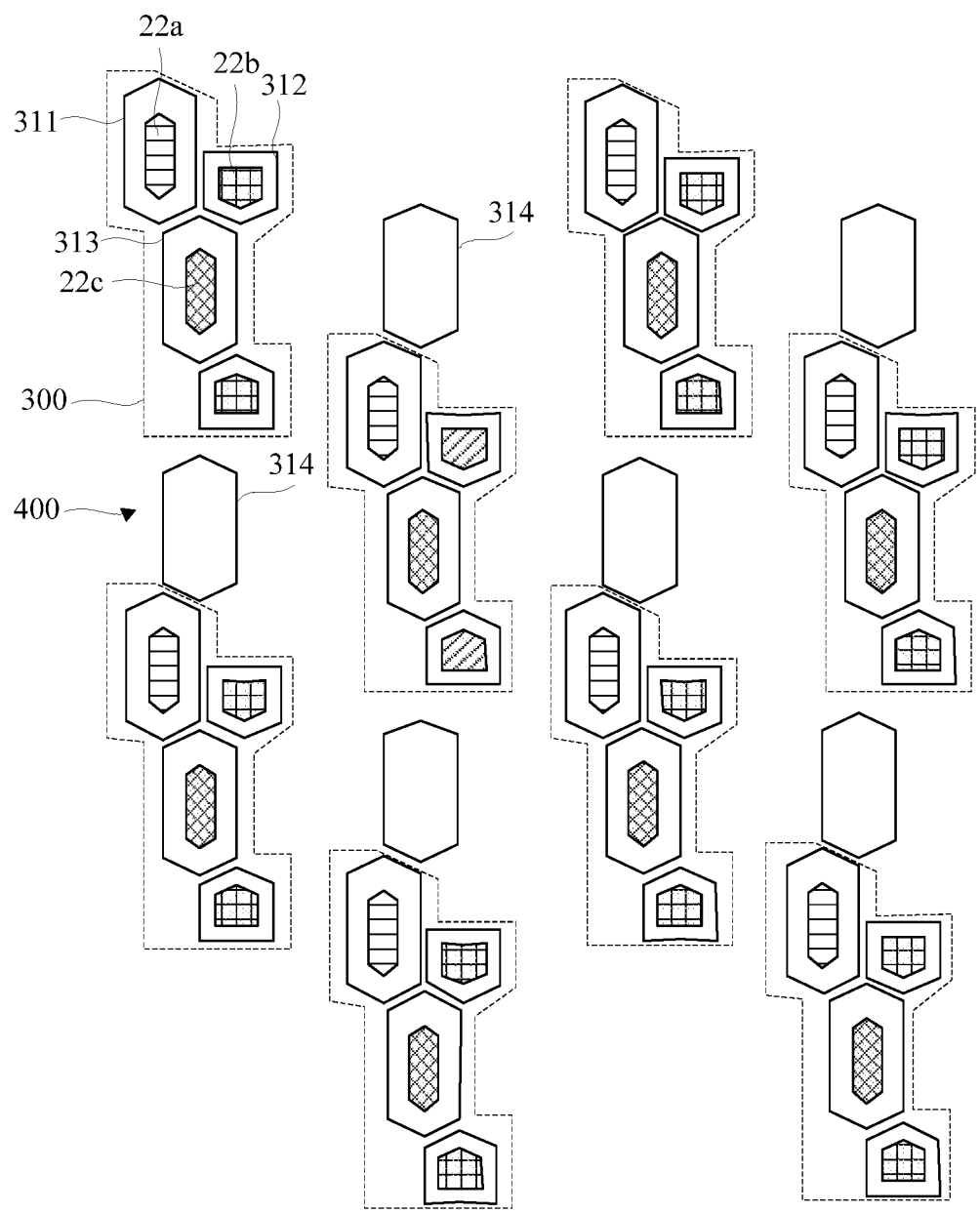
FIG. 4 is a schematic diagram of a partial structure of a first display region according to at least one embodiment of the present disclosure.

FIG. 4 is a schematic diagram of a partial structure of a first display region according to at least one embodiment of the present disclosure. FIG. 4 is a schematic partial enlarged view of region S1 in FIG. 1.

In some exemplary embodiments, As shown in FIG. 4, on a plane parallel to the display substrate, the first display region may include a plurality of sub-display regions 300 spaced apart from each other and a light-transmissive region 400 located between adjacent sub-display regions 300. No light-emitting unit is provided in the light-transmissive region 400. Incident light can reach the photosensitive element located underneath the display substrate through the light-transmissive region 400.

In some exemplary embodiments, as shown in FIG. 4, a plurality of first light-emitting units are disposed within each sub-display region 300 on a plane parallel to the display substrate. Each first light-emitting unit includes a light-emitting element and a drive circuit configured to drive the light-emitting element to emit light. In some examples, the plurality of first light-emitting units may include a fourth color light-emitting unit 22a, a fifth color light-emitting unit 22b, and a sixth color light-emitting unit 22c. A plurality of first light-emitting units within each sub-display region 300 may be arranged in such a manner that two fifth color light-emitting units 22b, a fourth color light-emitting unit 22a, and a sixth color light-emitting unit 22c are regarded as one repeating unit to be arranged regularly. In a repeating unit, a fourth color light-emitting unit 22a and a fifth color light-emitting unit 22b are arranged in the row direction; two fifth color light-emitting units 22b and one sixth color light-emitting unit 22c are arranged in the column direction, and the sixth color light-emitting unit 22c is located between the two fifth color light-emitting units 22b; and the sixth color light-emitting unit 22c is dislocated from the fourth color light-emitting unit 22a in the row direction, for example, with a shift of 0.5 times the width of the light-emitting unit between them. A pixel unit is provided within each sub-display region 300 and one pixel unit includes a fourth color light-emitting unit 22a, two fifth color light-emitting units 22b and a sixth color light-emitting unit 22c. However, this embodiment is not limited thereto. In some examples, a plurality of pixel units may be provided within each sub-display region.

In some exemplary embodiments, as shown in FIG. 4, on a plane parallel to the display substrate, the sixth color light-emitting unit 22c and the fourth color light-emitting unit 22a may both be hexagonal (e.g., rounded hexagon), and the fifth color light-emitting unit 22b may be pentagonal (e.g., rounded hexagon). The widths of the fourth color light-emitting unit 22a, the fifth color light-emitting unit 22b and the sixth color light-emitting unit 22c in the row direction may be the same, the lengths of the fourth color light-emitting unit 22a and the sixth color light-emitting unit 22c in the column direction may be the same, and the length of the fifth color light-emitting unit 22b in the column direction may be smaller than that of the fourth color light-emitting unit 22a and that of the sixth color light-emitting unit 22c, respectively. In some examples, the fourth color light-emitting unit 22a may be a red light-emitting unit, the fifth color light-emitting unit 22b may be a green light-emitting unit, and the sixth color light-emitting unit 22c may be a blue light-emitting unit. However, shapes and arrangement manner of the plurality of first light-emitting units in the sub-display region 300 are not limited in this embodiment. In some examples, the shapes and structures of the plurality of first light-emitting units of the sub-display region and the shapes and structures of the plurality of second light-emitting units of the second display region may be the same. However, this embodiment is not limited thereto. In some examples, each sub-display region may include light-emitting units of three colors such as a blue light-emitting unit, a green light-emitting unit, and a red light-emitting unit. The second display region may include light-emitting units of four colors such as a blue light-emitting unit, a green light-emitting unit, a red light-emitting unit, and a yellow light-emitting unit. Alternatively, in some examples, the arrangement of the plurality of first light-emitting units of each sub-display region may be different from the arrangement of the plurality of second light-emitting units of the second display region. For example, each of the sub-display regions and the second display regions may include strip-shaped red light-emitting units, strip-shaped green light-emitting units, and strip-shaped blue light-emitting units; the red light-emitting units, the green light-emitting units and the blue light-emitting units of each sub-display region may be arranged cyclically, and the red light-emitting units, the green light-emitting units and the blue light-emitting units of the second display region may be misplaced in a triangular distribution.

In some exemplary embodiments, as shown in FIG. 4, on a plane parallel to the display substrate, each sub-display region 300 of the first display region is provided with a plurality of first filter units, and the light-transmissive region 400 of the first display region is provided with a plurality of blue filter units 314. There is a blank gap between adjacent first filter units in each sub-display region 300 to improve the light transmittance of the sub-display region. The plurality of first filter units within each sub-display region 300 may include a fourth color filter unit 311, a fifth color filter unit 312, and a sixth color filter unit 313. In some examples, the fourth color filter unit 311 is a red filter unit, the fifth color filter unit 312 is a green filter unit, and the sixth color filter unit 313 is a blue filter unit. A plurality of first filter units within each sub-display region 300 are periodically arranged and correspond to a plurality of first light-emitting units one to one. The arrangement of the plurality of first filter units is the same as that of the plurality of first light-emitting units. The shape and position of the fourth color filter unit 311 may correspond to the fourth color light-emitting unit 22a, the shape and position of the fifth color filter unit 312 may correspond to the fifth color light-emitting unit 22b, and the shape and position of the sixth color filter unit 313 may correspond to the sixth color light-emitting unit 22c. For example, the fourth color filter unit 311 and the sixth color filter unit 313 may be hexagonal (e.g. rounded hexagon) and the fifth color filter unit 312 may be pentagonal (e.g. rounded pentagon). However, this embodiment is not limited thereto.

In some examples, the shapes of the plurality of blue filter units 314 within the light-transmissive region 400 may be the same as the shapes of the sixth color filter units 313 within the sub-display region 300, and the area of a single blue filter unit 314 may be greater than or equal to the area of a single sixth color filter unit 313. The area of any blue filter unit 314 within the light-transmissive region 400 may be greater than or equal to the area of any sixth color filter unit 313. Moreover, the position of the blue filter unit 314 in the light-transmissive region 400 may conform to the arrangement rule of the sixth color filter unit 313 in the plurality of sub-display regions 300. However, shapes and locations of the plurality of blue filter units 314 within the light-transmissive region 400 are not limited in this embodiment.

In an exemplary embodiment, as shown in FIG. 2, in a direction perpendicular to the display substrate, the first display region 100 includes: a flexible substrate 10, a display structure layer disposed on the flexible substrate 10, the thin film encapsulation layer 30 disposed on a side of the display structure layer away from the substrate 10, and a color filter layer disposed on a side of thin film encapsulation layer 30 away from the flexible substrate 10. The display structure layer includes a driving structure layer 20 and a light-emitting structure layer located at a side of the driving structure layer 20 away from the flexible substrate 10. The driving structure layer 20 of the sub-display region 300 includes a plurality of driving circuits and the driving structure layer 20 of the light-transmissive region 400 includes a composite insulating layer. The light-emitting structure layer of the sub-display region 300 includes a plurality of light-emitting elements and the light-emitting structure layer of the light-transmissive region 400 includes a pixel define layer 16. A plurality of drive circuits are in on-to-one correspondence with a plurality of light-emitting elements, and each drive circuit is configured to drive a corresponding light-emitting element to emit light. Each drive circuit includes a plurality of transistors and at least one storage capacitor, such as a 2T1C, 3T1C, or 7T1C design. The structure of the display structure layer of the sub-display region 300 is similar to that of the second display region 200 and therefore the description will not be repeated here. In the present exemplary embodiment, the light-transmissive region 400 is not provided with a light-emitting unit and is not used for display, but provides a transmission channel for external light to enter a photosensitive element underneath the display substrate.

In some exemplary embodiments, as shown in FIG. 2, the color filter layer of each sub-display region 300 includes a plurality of first filter units (e.g., a fourth color filter unit 311, a fifth color filter unit 312, and a sixth color filter unit 313) on a plane perpendicular to the display substrate. The color filter layer of the light-transmissive region 400 includes a plurality of blue filter units 314. The light exit direction of the first light-emitting unit of the sub-display region 300 faces the first filter unit. An orthographic projection of the fourth color filter unit 311 on the flexible substrate 10 is overlapped with an orthographic projection of the fourth color organic emitting layer 221 on the flexible substrate 10. an orthographic projection of the fifth color filter unit 312 on the flexible substrate 10 is overlapped with an orthographic projection of the fifth color organic emitting layer 222 on the flexible substrate 10, and an orthographic projection of the sixth color filter unit 313 on the flexible substrate 10 is overlapped with an orthographic projection of the sixth color organic emitting layer 223 on the flexible substrate 10. The color of the light transmitted by each first filter unit is the same as the color of the light emitted by the first light-emitting units overlapped with the first filter units, so that the first filter unit does not affect the passage of the color light emitted by the first light-emitting units. In addition, the first filter unit can allow external light of the same color as that of the first filter unit to pass through while absorbing light of other colors, thereby reducing the light intensity of the external light transmitted through the first filter unit. The color filter layer of the first display region 100 is covered with a light-transmissive over coat layer 35. The over coat layer 35 may fill a blank gap between adjacent first filter units within the sub-display region 300 and a region within the light-transmissive region 400 other than the plurality of blue filter units 314.

In some exemplary embodiments, the color coordinates of white spots and a first transmission spectrum of ambient light penetrating a display substrate may be obtained according to actual measurements, in this display substrate, the color filter layer of the light-transmissive region is not provided with filter units and a black matrix; then, according to the color coordinates of the selected color filter material, the thickness of the filter unit of the color filter layer and the area ratio of the blue filter unit in the light-transmissive region are adjusted (the brightness ratio is proportional to the area ratio) to obtain a second transmission spectrum; and the synthetic spectra after the light-transmissive region is provided with color filter layer is obtained by spectral superposition calculation, and then the color coordinates of white spots are calculated. By adjusting the thickness of the filter units of the color filter layer and the area ratio of the blue filter units in the light-transmissive region, the color coordinates of white spots calculated compositely can reach the desired value. Therefore, the blue light of the external light incident on the display substrate after passing through the color filter layer neutralizes and counteracts the influence of yellowing of the flexible display substrate, and optimizes the white balance of the outgoing light.

In some examples, the filter units of different colors of the color filter layer may be manufactured using a BY-3200 model color filter resin. Table 1 shows the color coordinates of different color filter resins of BY-3200 model under different thicknesses.

TABLE 1

| Color filter resin model | Color coordinate | Thickness | |
|---|---|---|---|
| | | 2.5 um | 0.5 um |
| BY-R3200 | x | 0.660 | 0.407 |
| | y | 0.315 | 0.288 |
| BY-G3200 | x | 0.243 | 0.286 |
| | y | 0.568 | 0.394 |
| BY-B3200 | x | 0.142 | 0.230 |
| | y | 0.086 | 0.238 |

Figure 5:
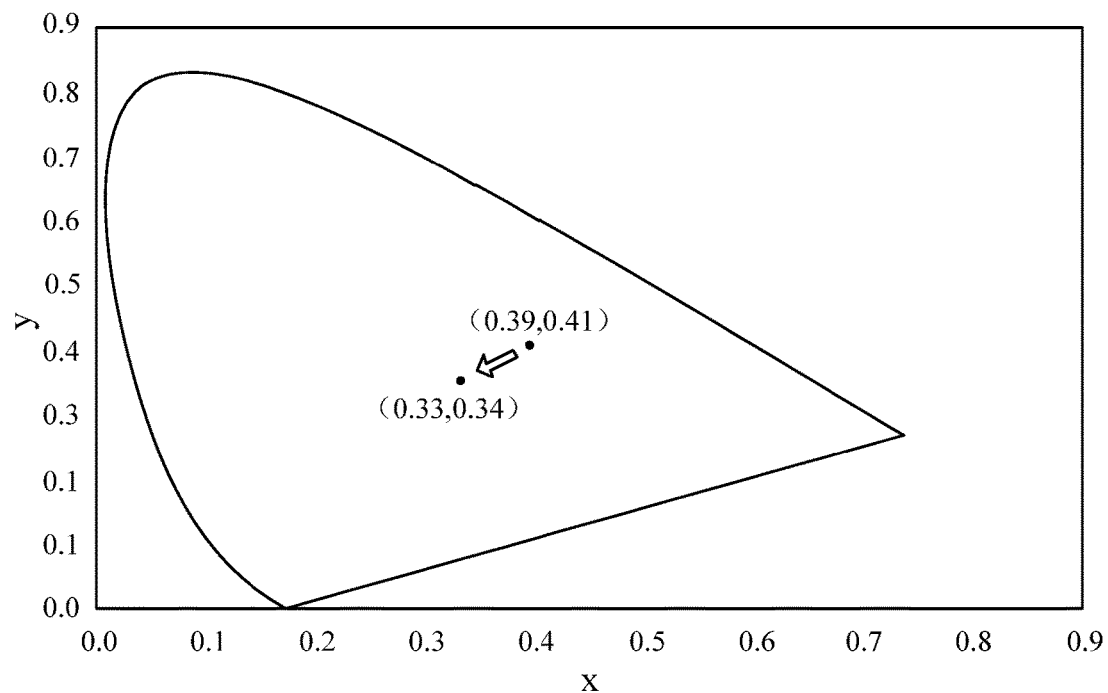
FIG. 5 is a schematic diagram of the light-transmission effect of a display substrate according to at least one embodiment of the present disclosure.

FIG. 5 is a schematic diagram of the light-transmission effect of a display substrate according to at least one embodiment of the present disclosure. In some exemplary embodiments, the filter unit of the color filter layer of the display substrate is made of BY-3200 color filter resin, and the thickness of the filter unit of the color filter layer is 0.5 microns. Only a plurality of blue filter units are provided in the color filter layer of the light-transmissive region and the total area of the plurality of blue filter units accounts for 28.6% of the total area of the light-transmissive region. As shown in FIG. 5, when the light-emitting unit is not provided in the display structure layer of the light-transmissive region and the color filter layer is not provided with the filter unit and the black matrix, the white spot color coordinates after the external light penetrates the display substrate from the first display region are x=0.39 and y=0.41. When the light-emitting unit is not arranged in the display structure layer of the light-transmissive region and only a plurality of blue filter units with an area ratio of 28.6% are arranged in the color filter layer, the white spot color coordinates after the external light penetrates the display substrate from the first display region may be adjusted to x=0.33 and y=0.34. In this way, the color of the light entering the photosensitive element underneath the display substrate may be adjusted, and the white balance and the imaging quality of the photosensitive element may be improved.

The structure of the display substrate of the embodiment of the present disclosure will now be described with reference to FIGS. 6 to 14 through an example of a preparation process of the display substrate with top emission structure. FIGS. 6 to 14 are schematic partial cross-sectional views along P-P in FIG. 1. A "patterning process" mentioned in the present disclosure includes film layer deposition, photoresist coating, masking exposure, development, etching, photoresist stripping, and other treatment. The deposition may be any one or more of sputtering, evaporation, and chemical vapor deposition. The coating may be any one or more of spray coating and spin coating. The etching may be any one or more of dry etching and wet etching. A "thin film" refers to a layer of thin film made of a certain material by a deposition or coating process on a substrate. If the patterning process is not needed by the "thin film" throughout the preparation process, the "thin film" may also be referred to as a "layer". When a patterning process is further needed by the "thin film" throughout preparation process, the thin film is referred to as a "thin film" before the patterning process and referred to as a "layer" after the patterning process. The "layer" after the patterning process includes at least one "pattern". "A and B are disposed on the same layer" mentioned in the present disclosure refers to that A and B are simultaneously formed by the same patterning process.

The process for preparing a display substrate according to the present exemplary embodiment includes following acts (1) to (9).

Figure 6:
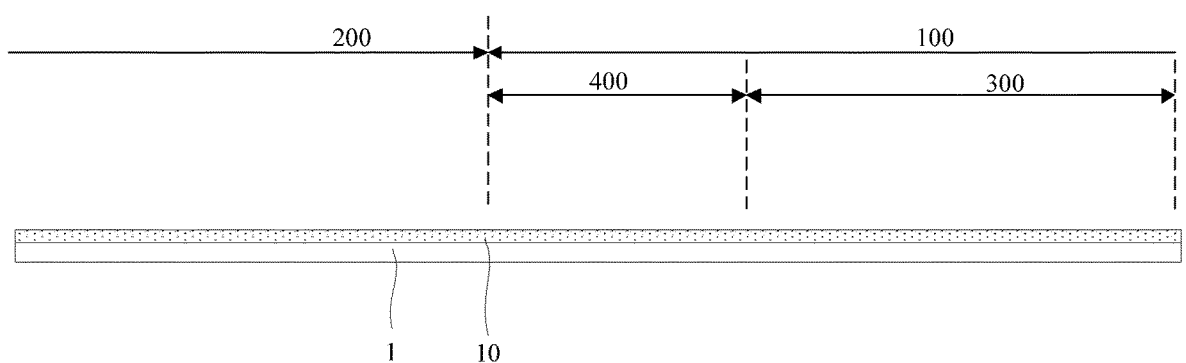
FIG. 6 is a schematic diagram of a display substrate after a flexible substrate is formed according to at least one embodiment of the present disclosure.

(1) A flexible substrate is prepared on a glass carrier plate. In some exemplary embodiments, the flexible substrate 10 include, for example, a first flexible material layer, a first inorganic material layer, a semiconductor layer, a second flexible material layer and a second inorganic material layer which are stacked on the glass carrier plate 1. The first flexible material layer and second flexible material layer are made of polyimide (PI), polyethylene terephthalate (PET) or a surface-treated polymer soft thin film or the like. The first inorganic material layer and the second inorganic material layer are made of silicon nitride (SiNx) or silicon oxide (SiOx), which is used to improve the water and oxygen resistance of the substrate. The first inorganic material layer and the second inorganic material layer are also referred to as Barrier layers. The semiconductor layer is made of amorphous silicon (a-si). In some exemplary embodiment, taking the laminated structure PI1/Barrier1/a-si/PI2/Barrier2 as an example, the preparation process includes: coating a layer of polyimide on the glass carrier plate, and forming a first flexible (PI1) layer after curing to form a film; subsequently, depositing a layer of barrier thin film on the first flexible layer to form a first barrier (Barrier 1) layer covering the first flexible layer; then depositing a layer of amorphous silicon thin film on the first barrier layer to form an amorphous silicon (a-si) layer covering the first barrier layer; then coating a layer of polyimide on the amorphous silicon layer, and forming a second flexible (PI2) layer after curing to form a film; then depositing a layer of barrier film on the second flexible layer to form a second barrier (Barrier 2) layer covering the second flexible layer, to complete the preparation of the flexible substrate 10. After the present process, both the first display region 100 and the second display region 200 include the flexible substrate 10, as shown in FIG. 6.

Figure 7:
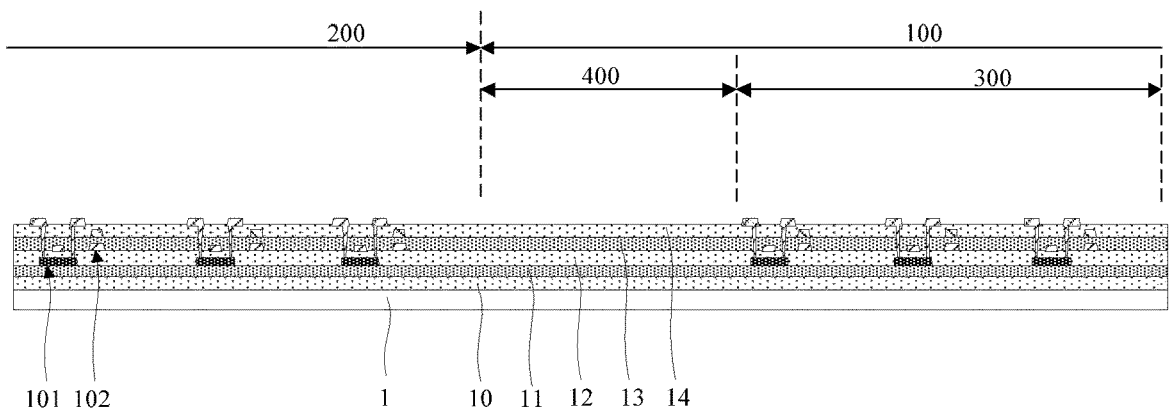
FIG. 7 is a schematic diagram of a display substrate after a drive structure layer is formed according to at least one embodiment of the present disclosure.

(2) A drive structure layer is prepared on the flexible substrate. The drive structure layer includes a plurality of drive circuits; each of the drive circuits includes a plurality of transistors and at least one storage capacitor. The structure of the drive structure layer in the second display region and the sub-display region is the same. The drive structure layer in the second display region is described as an example. As shown in FIG. 7, it is illustrated by taking each drive circuit only including one transistor and one storage capacitor as an example.

In some exemplary implementations, a preparation process of the driving structure layer may refer to the following descriptions.

A first insulating film and an active layer film are sequentially deposited on the flexible substrate 10, the active layer film is patterned through a patterning process to form a first insulating layer 11 covering the entire flexible substrate 10 and an active layer pattern disposed on the first insulating layer 11, wherein the active layer pattern includes at least the first active layer.

Then, a second insulating film and a first metal film are sequentially deposited, and the first metal film is patterned through a patterning process to form a second insulating layer 12 covering the active layer pattern and a first gate metal layer pattern disposed on the second insulating layer 12, wherein the first gate metal layer pattern includes at least a first gate electrode and a first capacitor electrode.

Then, a third insulating film and a second metal film are sequentially deposited, and the second metal film is patterned through a patterning process to form a third insulating layer 13 covering the first gate metal layer and a second gate metal layer pattern disposed on the third insulating layer 13, wherein the second gate metal layer pattern includes at least a second capacitor electrode, and the position of the second capacitor electrode corresponds to that of the first capacitor electrode.

Then, a fourth insulation thin film is deposited and patterned by the patterning process to form a pattern of a fourth insulation layer 14 covering the second gate metal layer, the fourth insulation layer 14 is provided with at least two first via holes where the fourth insulation layer 14, the third insulation layer 13 and the second insulation layer 12 in the at least two first via holes are etched, exposing the surface of the active layer 12.

Then, a third metal thin film is deposited and patterned by the patterning process, and a pattern of a source-drain metal layer is formed on the fourth insulating layer 14, and the source-drain metal layer at least includes a first source electrode and a first drain electrode located in the second display region 200 and the sub-display region 300. The first source electrode and the first drain electrode are connected to the first active layer by a first via hole, respectively.

At this moment, the drive structure layers of the sub-display region 300 and the second display region 200 are prepared on the flexible substrate 10. As shown in FIG. 7, in the driving structure layer of the second display region 200, the first active layer, the first gate electrode, the first source electrode and the first drain electrode together form a first transistor 101, and the first capacitor electrode and the second capacitor electrode together form a first storage capacitor 102. After this process, the light-transmissive region 400 may include the first insulating layer 11, the second insulating layer 12, the third insulating layer 13 and the fourth insulating layer 14 stacked on the flexible substrate 10.

In some exemplary implementation modes, the first insulating layer 11, the second insulating layer 12, the third insulating layer 13 and the fourth insulating layer 14 are made of any one or more of silicon oxide (SiOx), silicon nitride (SiNx), and silicon oxynitride (SiON), and may be in a single-layer, multi-layer, or a composite layer. The first insulating layer 11 is referred to as a buffer layer, which is used for improving capabilities of water-resistance and oxygen-resistance of the substrate. The second insulating layer 12 and the third insulating layer 13 are referred to as gate insulating (GI) layers. The fourth insulating layer 14 is referred to as an interlayer insulating (ILD) layer. The first metal thin film, the second metal thin film and the third metal thin film are made of metal materials, such as any one or more of Argentum (Ag), Copper (Cu), Aluminum (Al), Titanium (Ti), and Molybdenum (Mo), or alloy materials of the above-mentioned metals, such as an Aluminum-Neodymium alloy (AlNd) or a Molybdenum-Niobium alloy (MoNb), and may be in a single-layer structure, or a multilayer composite structures such as Ti/Al/Ti. The active layer thin film is made of one or more of the materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene, etc. That is, the present disclosure is applicable to transistors that are manufactured based on oxide technology, silicon technology and organics technology.

Figure 8:
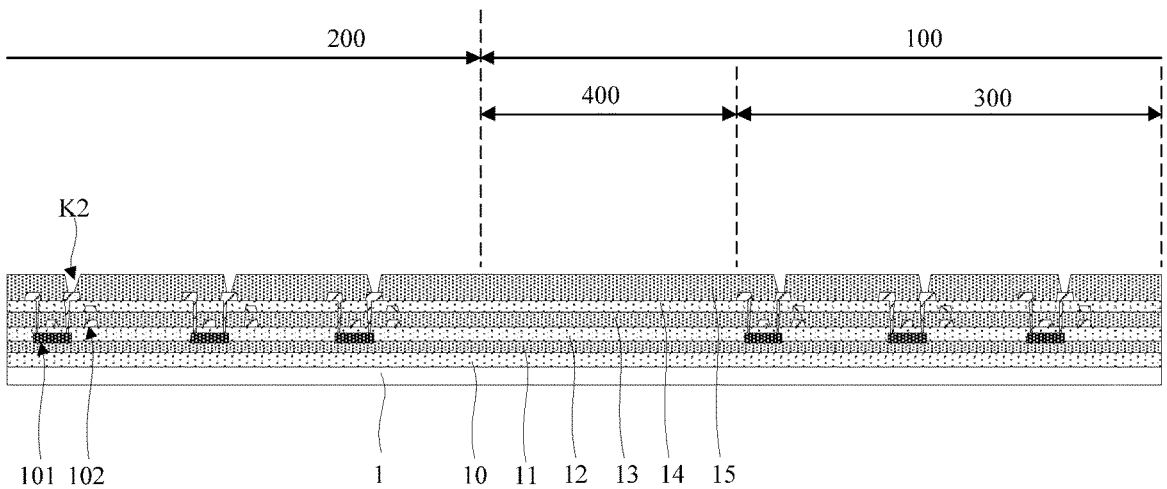
FIG. 8 is a schematic diagram of a display substrate after a planarization layer is formed according to at least one embodiment of the present disclosure.

(3) A planarization layer is formed on the flexible substrate on which the aforementioned patterns are formed. In some exemplary implementations, a planarization thin film of an organic material is coated on the flexible substrate 10 on which the abovementioned patterns are formed to form a planarization (PLN) layer 15 covering the entire flexible substrate 10. A plurality of second vias K2 are formed on the planarization layer 15 in the second display region 200 and the sub-display region 300 through masking, exposure and development processes, as shown in FIG. 8. The planarization layer 15 in the each second via K2 is developed off to expose the surface of the first drain electrode of the first transistor 101. After this patterning process, the light-transmissive region 400 may include the first insulating layer 11, the second insulating layer 12, the third insulating layer 13, the fourth insulating layer 14 and the planarization layer 15 stacked on the flexible substrate 10.

Figure 9:
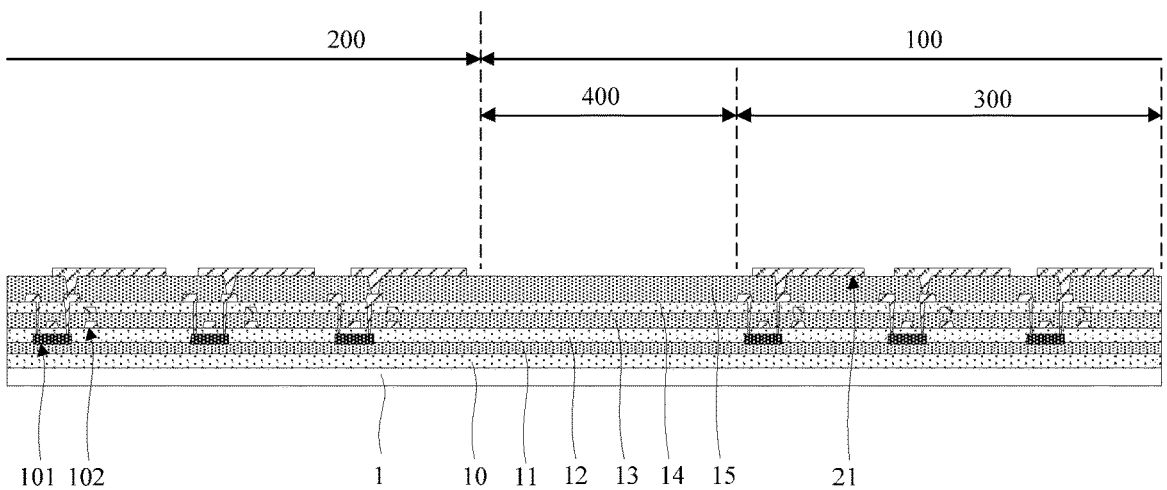
FIG. 9 is a schematic diagram of a display substrate after a first electrode layer is formed according to at least one embodiment of the present disclosure.

(4) Forming a pattern of the first electrode layer on the flexible substrate on which the aforementioned patterns are formed. In some exemplary implementation modes, a conductive thin film is deposited on the flexible substrate 10 with the above-mentioned structures formed. The conductive thin film is patterned through a patterning process to form a pattern of a first electrode layer 21. The first electrode layer 21 is formed in the second display region 200 and the sub-display region 300. The first electrode layer 21 includes a plurality of anodes, each of which is connected to a first drain electrode of the first transistor 101 through a second via K2, as shown in FIG. 9.

In some examples, the first electrode layer 21 may include a first light-transmissive conductive layer, a reflective layer on the first light-transmissive conductive layer, and a second light-transmissive conductive layer on the reflective layer. The first light-transmissive conductive layer and the second light-transmissive conductive layer may be made of a light-transmissive conductive material such as Indium Tin Oxide (ITO) or Indium Zinc Oxide (IZO). The reflective layer may be a metal layer, for example, made of silver. However, this embodiment is not limited thereto. In some examples, a first electrode layer 21 may be made of metal material, such as any one or more of magnesium (Mg), silver (Ag), copper (Cu), aluminum (Al), titanium (Ti) and molybdenum (Mo), or alloy of the above metals, such as aluminum neodymium alloy (AlNd) or molybdenum niobium alloy (MoNb), and may have a single-layered structure or a multi-layered composite structure, such as Ti/Al/Ti.

After this patterning process, the film layer structure of the light-transmissive region 400 does not change.

(5) A pattern of a Pixel Define Layer (PDL) is formed on the flexible substrate on which the aforementioned patterns are formed.

Figure 10:
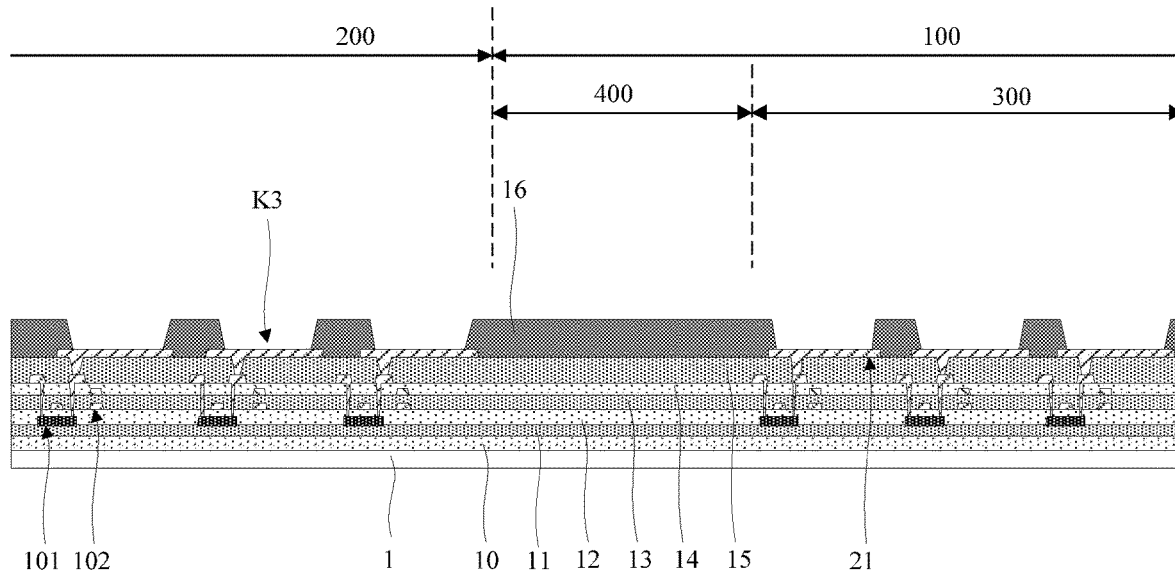
FIG. 10 is a schematic diagram of a display substrate after a pixel define layer is formed according to at least one embodiment of the present disclosure.

In some exemplary implementations, a pixel define thin film is coated on the flexible substrate 10 on which the aforementioned patterns are formed, and a pattern of the pixel define layer 16 is formed through masking, exposure, and development processes. As shown in FIG. 10, a plurality of sub-pixel openings K3 are provided in the pixel define layer 16 of the second display region 200 and the sub-display region 300, and the pixel define layer 16 in each of the sub-pixel openings K3 is developed to expose the surface of an anode of the first electrode layer 21. After this patterning process, the light-transmissive region 400 includes the first insulating layer 11, the second insulating layer 12, the third insulating layer 13, the fourth insulating layer 14, the planarization layer 15 and the pixel define layer 16 stacked on the flexible substrate 10.

In some examples, the pixel define layer 16 may be made of materials such as polyimide, acrylic, or polyethylene terephthalate, etc.

(6) Sequentially forming an organic emitting layer and a second electrode on the flexible substrate where the abovementioned patterns are formed.

Figure 11:
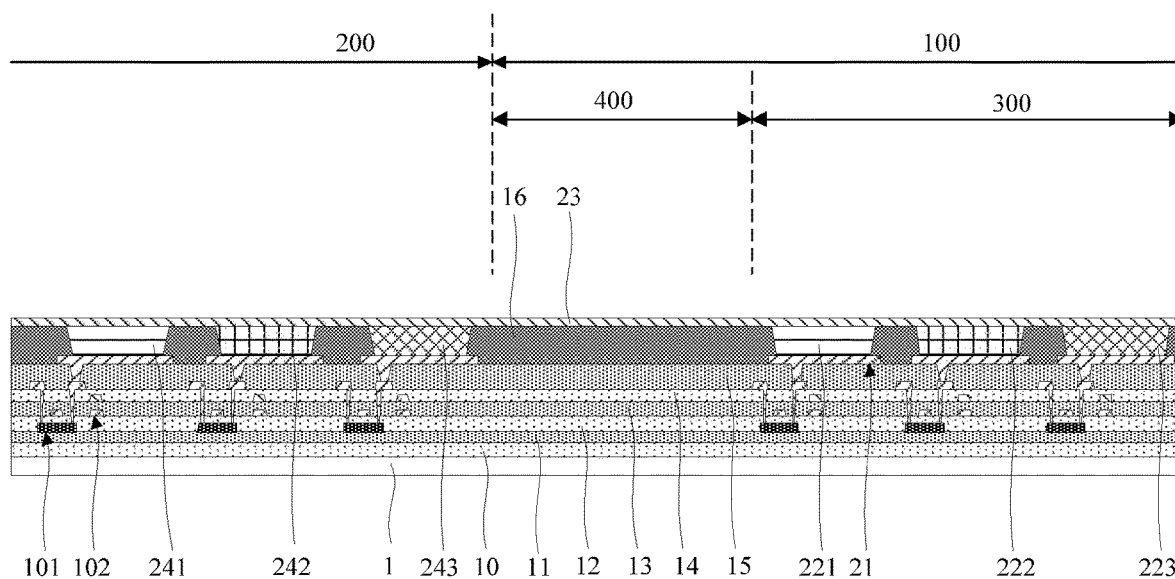
FIG. 11 is a schematic diagram of a display substrate after a second electrode is formed according to at least one embodiment of the present disclosure.

In some exemplary embodiments, as shown in FIG. 11, a first color organic emitting layer 241 of the first color light-emitting unit 24a, a second color organic emitting layer 242 of the second color light-emitting unit 24b, and a third color organic emitting layer 243 of the third color light-emitting unit 24c may be respectively formed within a plurality of sub-pixel openings K3 of the pixel define layer 16 of the second display region 200. A fourth color organic emitting layer 221 of the fourth color light-emitting unit 22a, a fifth color organic emitting layer 222 of the fifth color light-emitting unit 22b, and a sixth color organic emitting layer 223 of the sixth color light-emitting unit 22c may be formed in a plurality of sub-pixel openings K3 of the pixel define layer 16 of the sub-display region 300, respectively.

In some examples, any organic emitting layer 24 may include a hole injection layer, a hole transporting layer, a emitting layer, an electron transporting layer, and an electron injection layer that are stacked. The organic emitting layer is formed in the sub-pixel openings of the pixel define layer 16 in the second display region 200 and the sub-display region 300, thereby achieving the connection between the organic emitting layer and the anode of the first electrode layer 21. The second electrode 23 is formed on the pixel define layer 16, connected to the organic emitting layer.

In some examples, the second electrode 23 is a transparent cathode made of a light-transmissive conductive material such as ITO or IZO. The light-emitting element may emit light from a side away from the flexible substrate 10 through the transparent electrode so as to achieve top emission.

After this patterning process, the light-transmissive region 400 includes the first insulating layer 11, the second insulating layer 12, the third insulating layer 13, the fourth insulating layer 14, the planarization layer 15, the pixel define layer 16 and the second electrode 23 stacked on the flexible substrate 10.

(7) A Thin-Film Encapsulation (TFE) layer is formed on a flexible substrate on which the aforementioned patterns are formed.

Figure 12:
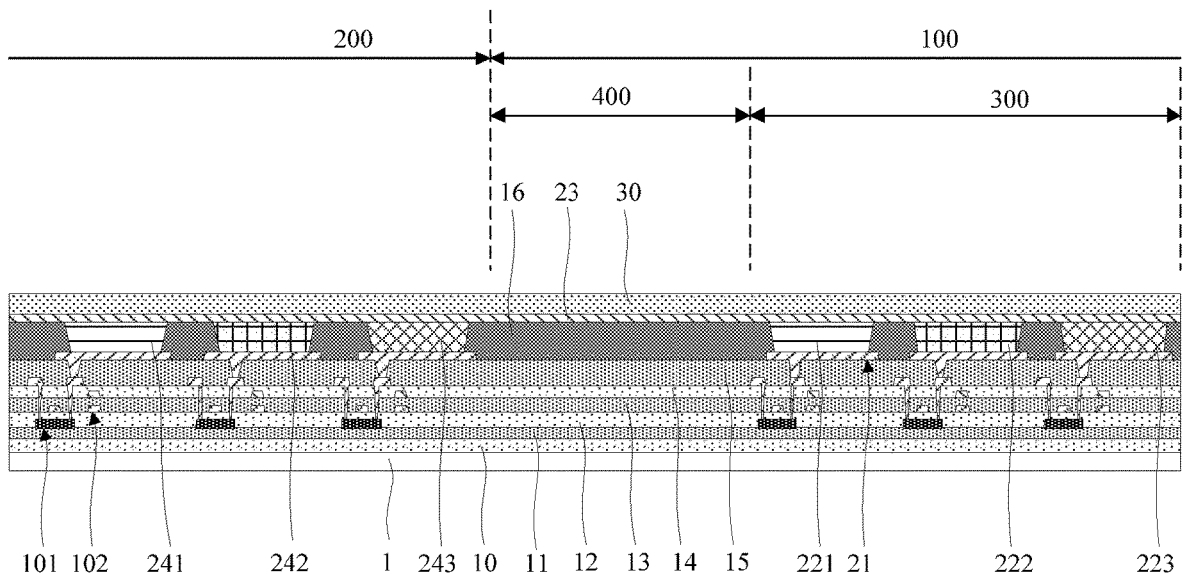
FIG. 12 is a schematic diagram of a display substrate after a thin film encapsulation layer is formed according to at least one embodiment of the present disclosure.

In some exemplary embodiments, as shown in FIG. 12, a thin film encapsulation layer 30 is formed on a flexible substrate 10 on which the aforementioned patterns are formed. In some examples, the thin film encapsulation layer 30 may include a first encapsulation layer, second encapsulation layer and third encapsulation layer which are stacked. The first encapsulation layer is made of an inorganic material, and covers the second electrode 23 in the first display region 100 and the second display region 200. The second encapsulation layer is made of an organic material. The third encapsulation layer is made of an inorganic material, and covers the first encapsulation layer and the second encapsulation layer. However, this embodiment is not limited thereto. In some examples, the thin film encapsulation layer may be of an inorganic/organic/inorganic/organic/inorganic five-layer structure.

After this patterning process, the light-transmissive region 400 includes the first insulating layer 11, the second insulating layer 12, the third insulating layer 13, the fourth insulating layer 14, the planarization layer 15, the pixel define layer 16, the second electrode 23 and the thin film encapsulation layer stacked on the flexible substrate 10.

(8) Forming a color filter layer on the flexible substrate on which the aforementioned patterns are formed.

Figure 13:
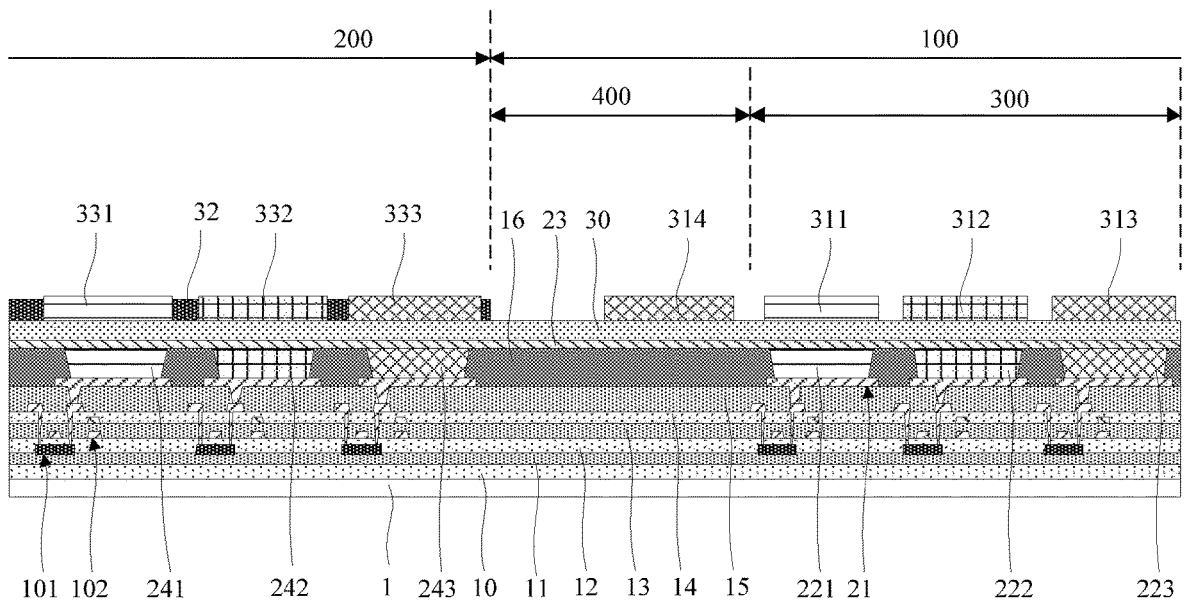
FIG. 13 is a schematic diagram of a display substrate after a color filter layer is formed according to at least one embodiment of the present disclosure.

In some exemplary embodiments, as shown in FIG. 13, a black pigment or a black chromium (Cr) thin film is coated on a side of the film encapsulation layer 30 of the second display region 200 away from the flexible substrate 10, and the black pigment or the black chromium thin film is patterned through a patterning process to form a pattern of the black matrix 32. Then, a plurality of red filter units (for example, including a plurality of first color filter units 331 of the second display region 200 and a plurality of fourth color filter units 311 of the sub-display region 300) and a plurality of green filter units (e.g., including a plurality of second color filter units 332 of the second display region 200 and a plurality of fifth color filter units 312 of the sub-display region 300) are sequentially formed in the second display region 200 and the sub-display region 300. A plurality of blue filter units are formed in the second display region 200, the sub-display region 300 and the light-transmissive region 400 (e.g., including a plurality of blue filter units 314 formed in the light-transmissive region 400, a plurality of third color filter units 333 formed in the second display region 200, and a plurality of sixth color filter units 313 formed in the sub-display region 300). Taking the formation of the red filter unit as an example, the thin film encapsulation layer 30 formed with the black matrix 32 formed is coated with a red resin at first, and the red filter units are formed by masking, exposure and development after baking-curing. The green filter units and the blue filter units are formed through similar processes, which will not be repeated herein.

After this process, the second display region 200 includes red filter units, green filter units and blue filter units periodically arranged in the same layer, and a black matrix 32 is provided in a gap area between adjacent filter units. A sub-display region 300 of the first display region 100 includes red filter units, green filter units and blue filter units periodically arranged in the same layer, and there is a blank gap between adjacent filter units. The filter units of the second display region 200 and the sub-display region 300 respectively correspond to the light-emitting unit of the display driving layer, so that light emitted from the light-emitting unit is emitted through the corresponding filter units. The light-transmissive region 400 includes only a plurality of blue filter units 314.

Figure 14:
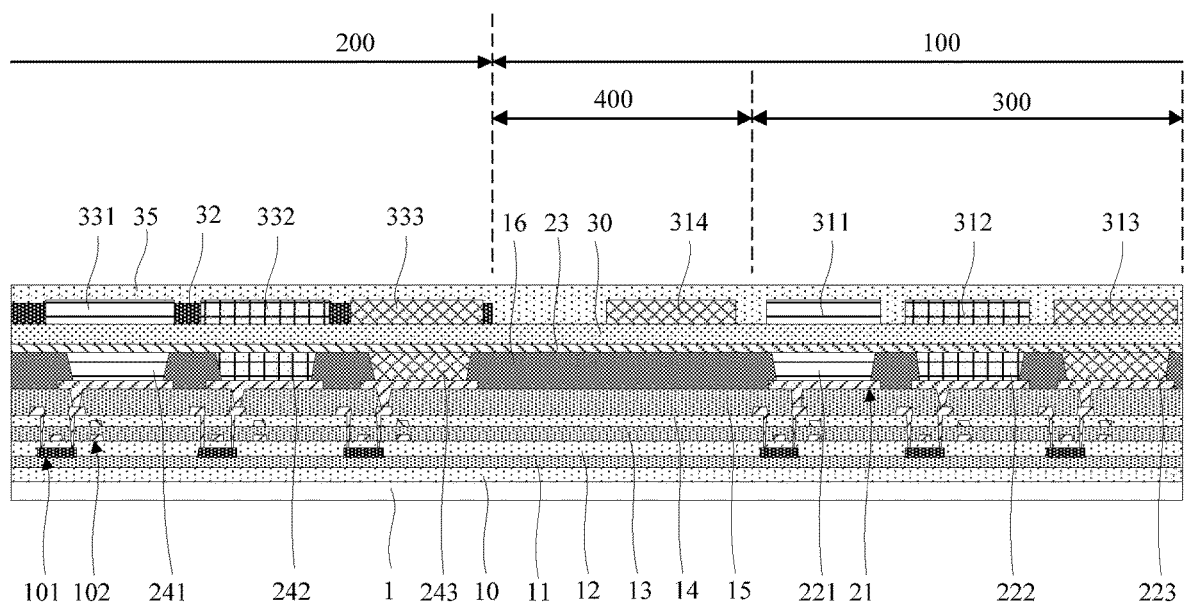
FIG. 14 is a schematic diagram of a display substrate after an over coat layer is formed according to at least one embodiment of the present disclosure.

(9) Forming an Over Coat (OC) layer on the flexible substrate on which the aforementioned patterns are formed. In some exemplary embodiments, as shown in FIG. 14, an organic material is coated on the first display region 100 and second display region 200 to form an over coat layer 35 covering the color filter layer. The over coat layer 35 may be made of a transparent organic material.

After the foregoing acts, the flexible substrate 10 is removed from the glass carrier plate 1 using a laser peeling process to obtain the display substrate of this embodiment.

In the exemplary embodiment, the external light becomes blue after passing through the color filter layer of the first display region (increasing the proportion of blue light), which then passes through the flexible substrate with light yellow color, and may be restored to white light, and enters the photosensitive element under the display substrate. By arranging a plurality of blue filter units in the color filter layer of the light-transmissive region of the first display region, the color of light rays penetrating the display substrate and entering the photosensitive element through the first display region may be adjusted, thereby optimizing the white balance and improving the imaging quality of the photosensitive element.

The display substrate of the exemplary embodiment of the present disclosure may be achieved by changing the mask pattern during the preparation of the color filter layer without adding additional processes and costs. The preparation process of the present exemplary embodiment may be implemented using an existing mature preparation device, and is compatible well with an existing preparation process, simple in process implementation, easy to implement, high in production efficiency and yield, and low in production cost.

The structure and manufacturing process of the display substrate in the exemplary embodiment of the present disclosure is only an exemplary description. In some exemplary embodiments, changes in corresponding structures and, addition or deletion of patterning processes may be made according to actual needs. For example, the arrangement of the second light-emitting units in the second display region may be different from the arrangement of the first light-emitting units in the sub-display region. For another example, the second light-emitting unit of the second display region may include light-emitting units of four colors, and the first light-emitting unit of the sub-display region may include light-emitting units of three colors. However, the present disclosure is not limited thereto.

Figure 15:
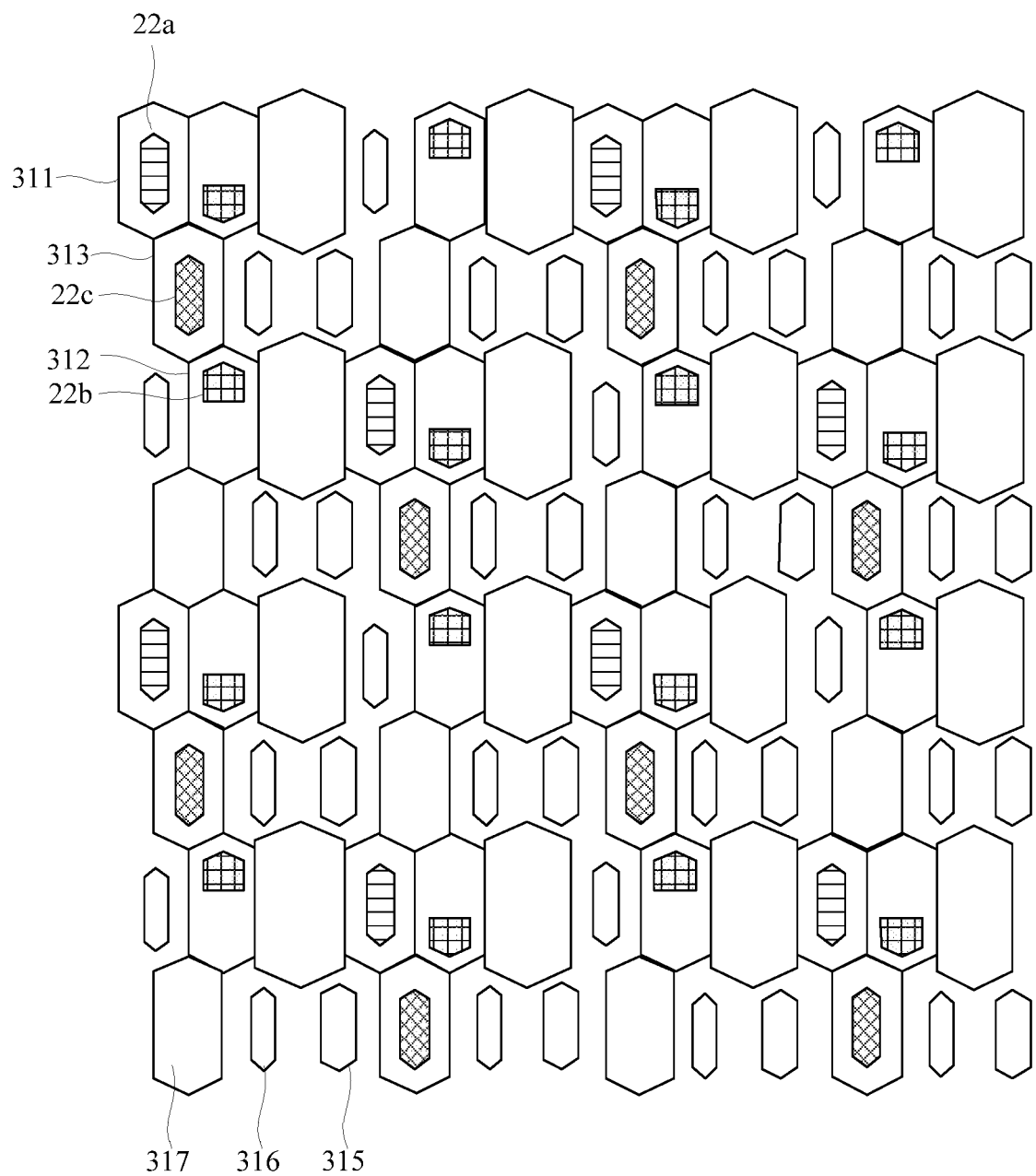
FIG. 15 is schematic diagram of another partial structure of a first display region according to at least one embodiment of the present disclosure.
Figure 16:
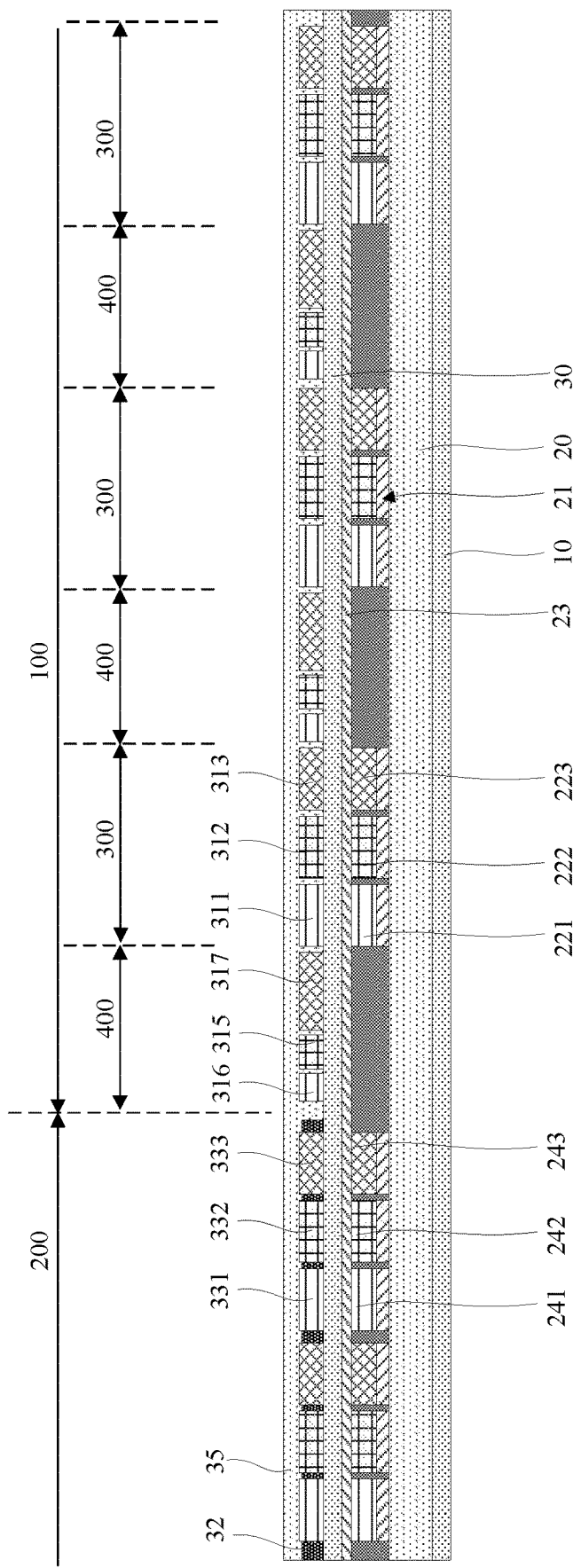
FIG. 16 is another schematic sectional view along the P-P direction in FIG. 1.

FIG. 15 is a schematic diagram of a partial structure of a first display region according to at least one embodiment of the present disclosure. FIG. 15 is a schematic partial enlarged view of region S1 in FIG. 1. FIG. 16 is another schematic sectional view along a P-P direction in FIG. 1.

In some exemplary embodiments, as shown in FIG. 15, on a plane parallel to the display substrate, the color filter layer of the light-transmissive region of the first display region includes a first red filter unit 316, a first green filter unit 315, and a first blue filter unit 317 arranged periodically. There is a blank gap between adjacent filter units. The total area of the first blue filter unit 317 is larger than the total area of the first red filter unit 316 and larger than the total area of the first green filter unit 315. In some examples, the area of the single first red filter unit 316 is smaller than that of the single first green filter unit 315, the area of the single first green filter unit 315 is smaller than that of the single first blue filter unit 317, and the area of the single first blue filter unit 317 is larger than the sum of the areas of the single first red filter unit 316 and the first green filter unit 315. However, this embodiment is not limited thereto. For example, the area of the single first blue filter unit may be larger than the area of the single first green filter unit and the area of the single first red filter unit, and the area of the single first blue filter unit may be smaller than the sum of the areas of the single first red filter unit and the single first green filter unit.

In some exemplary embodiments, as shown in FIG. 15, the first blue filter unit 317, the first green filter unit 315, and the first red filter unit 316 of the light-transmissive region may be hexagonal on a plane parallel to the display substrate. The width of the first blue filter unit 317 in a row direction may be greater than the width of the first green filter unit 315 in the row direction, and the width of the first green filter unit 315 in the row direction may be greater than the width of the first red filter unit 316 in the row direction. The length of the first blue filter unit 317 in the column direction may be greater than the length of the first green filter unit 315 in the column direction. The length of the first green filter unit 315 in the column direction may be the same as the length of the first red filter unit 316 in the column direction. However, shapes of the filter units in the light-transmissive region are not limited in this embodiment. For example, the filter units in the light-transmissive region may all be rectangular. In some examples, the shapes of the first blue filter unit, the first green filter unit, and the first red filter unit may be identical, partially identical, or all different.

In some exemplary embodiments, as shown in FIGS. 15 and 16, the display structure layer of each sub-display region 300 of the first display region 100 includes a plurality of first light-emitting units, including, for example, a fourth color light-emitting unit 22a, a fifth color light-emitting unit 22b, and a sixth color light-emitting unit 22c. The color filter layer of each sub-display region 100 includes a plurality of first filter units periodically arranged, including, for example, a fourth color filter unit 311, a fifth color filter unit 312, and a sixth color filter unit 313. The color of each of the first filter units is the same as the light exit color of the first light-emitting units overlapped with the first filter units in a direction perpendicular to the flexible substrate 10. The area of the single first blue filter unit 317 of the light-transmissive region 400 is larger than the area of the single second blue filter unit (i.e., the sixth color filter unit 313) of the sub-display region 300, the area of the single first red filter unit 316 of the light-transmissive region 400 is smaller than the area of the single second red filter unit (i.e., the fourth color filter unit 311) of the sub-display region 300, and the area of the single first green filter unit 315 of the light-transmissive region 400 is smaller than the area of the single second green filter unit (i.e., the fifth color filter unit 312) of the sub-display region 300.

In some examples, the second blue filter unit (i.e., the sixth color filter unit 313), the second red filter unit (i.e., the fourth color filter unit 311), and the second green filter unit (i.e., the fifth color filter unit 312) of the sub-display region 300 may be hexagonal. The arrangement of the filter units in the sub-display region 300 corresponds to the arrangement of the first light-emitting units. The arrangement of the first red filter unit, the first green filter unit and the first blue filter unit in the light-transmissive region 400 is the same as the arrangement of the second red filter unit, the second green filter unit and the second blue filter unit in the sub-display region 300. However, this embodiment is not limited thereto. In some examples, the arrangement of the first red filter unit, the first green filter unit and the first blue filter unit in the light-transmissive region may be different from the arrangement of the second red filter unit, the second green filter unit and the second blue filter unit in the sub-display region.

Other structures of the sub-display region of the first display region and the second display region in the exemplary embodiments are similar to corresponding structures described in the foregoing embodiments, which hence will not be repeated here.

Figure 17:
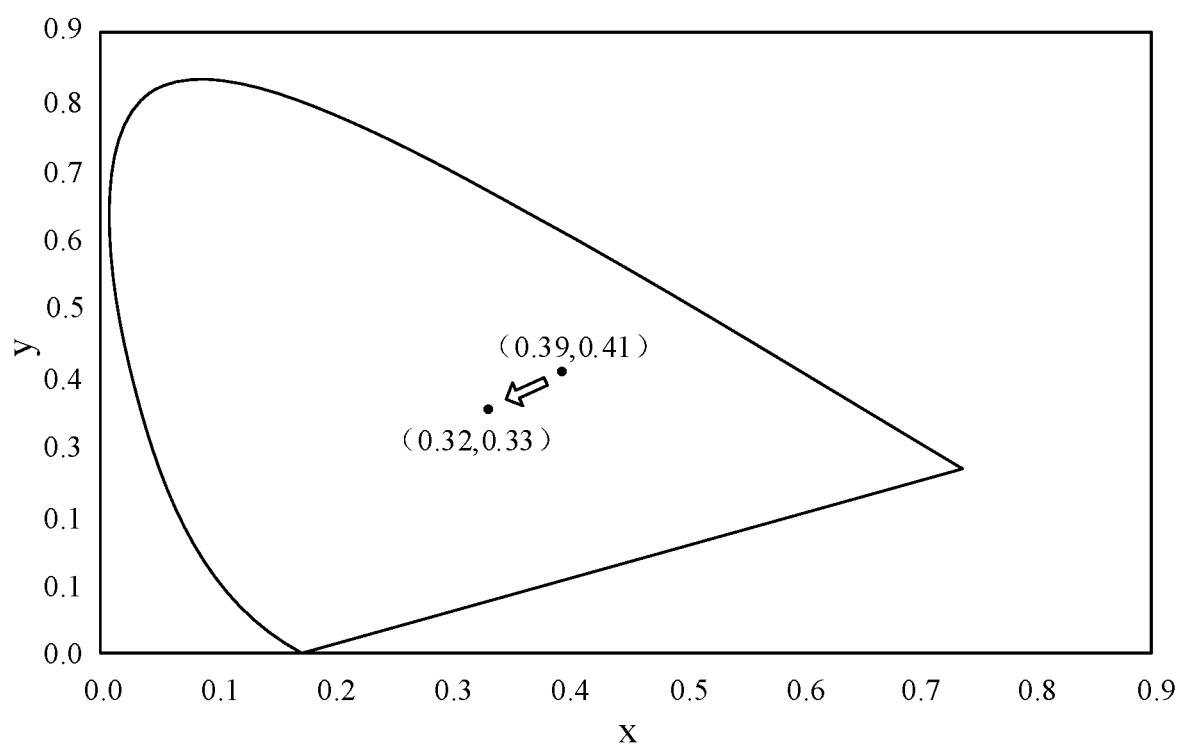
FIG. 17 is a schematic diagram of the light-transmission effect of a display substrate according to at least one embodiment of the present disclosure.

FIG. 17 is a schematic diagram of the light-transmission effect of a display substrate according to at least one embodiment of the present disclosure. In some exemplary embodiments, the filter unit of the color filter layer of the display substrate is made of BY-3200 color filter resin, and the thickness of the filter unit of the color filter layer is 0.5 microns. A first red filter unit, a first green filter unit and a first blue filter unit arranged periodically are provided in the color filter layer of the light-transmissive region. The total area of the first blue filter unit accounts for 54% of the total area of the light-transmissive region, the total area of the first red filter unit accounts for 19% of the total area of the light-transmissive region, and the total area of the first green filter unit accounts for 27% of the total area of the light-transmissive region. As shown in FIG. 17, when the light-emitting unit is not provided in the display structure layer of the light-transmissive region and the color filter layer is not provided with the filter unit and the black matrix, the white spot color coordinates after the external light penetrates the display substrate from the first display region are x=0.39 and y=0.41. When the display structure layer of the light-transmissive region is not provided with a light-emitting unit and the color filter layer is provided with a plurality of first blue filter units with a total area accounting for 54%, a plurality of first red filter units with a total area accounting for 19% and a plurality of first green filter units with a total area accounting for 27%, the color coordinates of the white spots after the external light penetrates the display substrate from the first display region may be adjusted to x=0.32 and y=0.33. In this way, the light color entering the photosensitive element underneath the display substrate may be adjusted, and the white balance and the imaging quality of the photosensitive element may be improved.

The structure (or method) shown in this embodiment may be combined with structures (or methods) shown in other embodiments as appropriate.

The display substrate of the exemplary embodiment of the present disclosure may be achieved by changing the mask pattern during the preparation of the color filter layer without adding additional processes and costs. The preparation process of the present exemplary embodiment may be implemented using an existing mature preparation device, and is compatible well with an existing preparation process, simple in process implementation, easy to implement, high in production efficiency and yield, and low in production cost.

Figure 18:
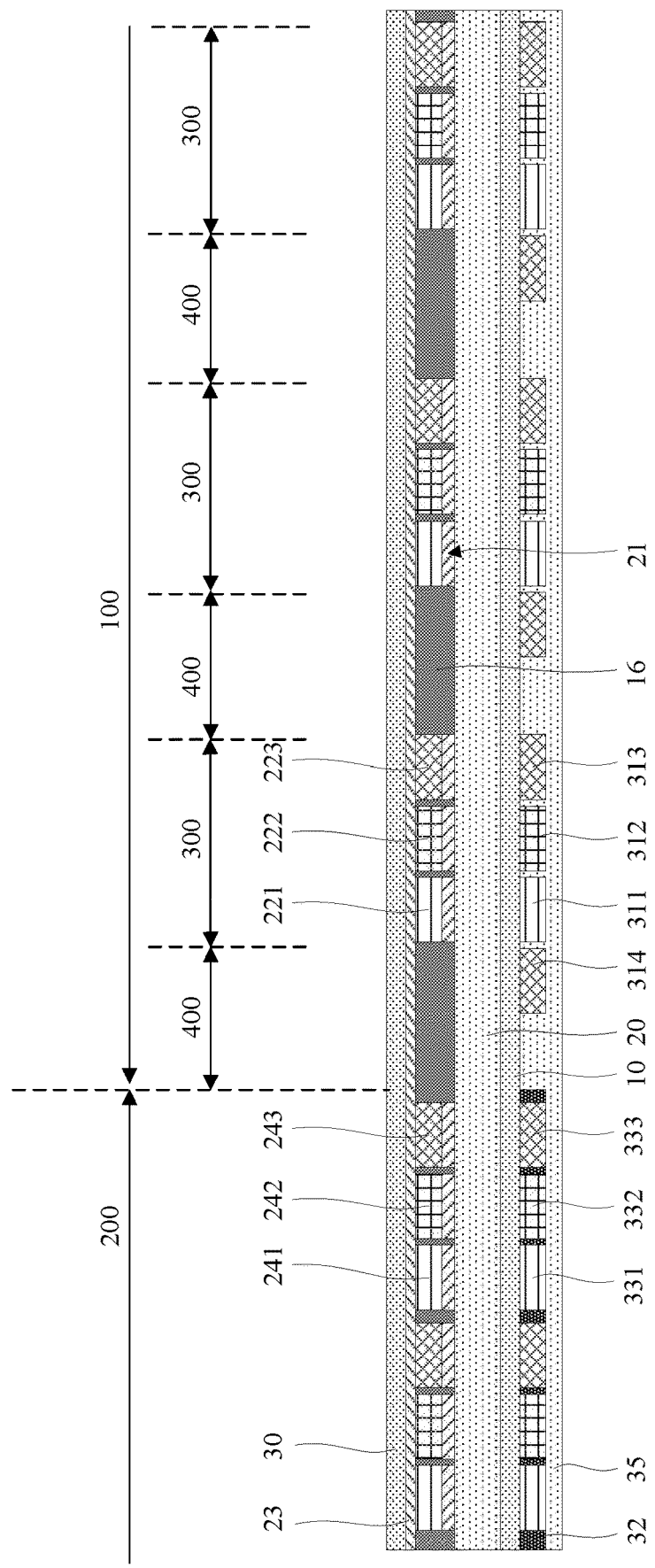
FIG. 18 is schematic diagram of another structure of a display substrate according to at least one embodiment of the present disclosure.

FIG. 18 is schematic diagram of another structure of a display substrate according to at least one embodiment of the present disclosure. FIG. 18 is a schematic sectional view along a P-P direction in FIG. 1. As shown in FIG. 18, the display substrate of the present exemplary embodiment is a bottom emission structure. On a plane perpendicular to the display substrate, the display substrate includes a flexible substrate 10, a display structure layer disposed on a side of the flexible substrate 10, the thin film encapsulation layer 30 disposed on a side of the display structure layer away from the flexible substrate 10, and a color filter layer disposed on the other side of the flexible substrate 10. The color filter layer is located on the light exit side of the display substrate. The display structure layer includes a driving structure layer 20 and a light-emitting structure layer located at a side of the driving structure layer 20 away from the flexible substrate 10. The light-emitting structure layer includes a plurality of light-emitting elements. Each light-emitting element includes a first electrode layer 21, an organic light-emitting layer located on a side of the first electrode layer 21 away from the flexible substrate 10, and a second electrode 23 located on a side of the organic light-emitting layer away from the flexible substrate 10. The first electrode 21 may include a transparent anode and the second electrode 23 may be a reflective cathode. The rest of structures of the driving structure layer, the color filter layer and the light-emitting structure layer of the present embodiment may be described with reference to the foregoing embodiments, which will not be repeated here.

The structure (or method) shown in this embodiment may be combined with structures (or methods) shown in other embodiments as appropriate.

At least one embodiment of the present disclosure also provides a method for preparing a display substrate, which includes providing a flexible substrate including a first display region, wherein the first display region includes at least one sub-display region and at least one light-transmissive region; forming a display structure layer on the flexible substrate; and forming a color filter layer on a light exit side of the display structure layer and the at least one light-transmissive region. The display structure layer includes a plurality of first light-emitting units disposed in the at least one sub-display region. The color filter layer of the at least one light-transmissive region includes a plurality of blue filter units; or, the color filter layer of the at least one light-transmissive region includes first red filter units, first green filter units, and first blue filter units which are periodically arranged, wherein the total area of the first blue filter units is greater than that of the first red filter units, and the total area of the first blue filter units is greater than that of the first green filter units.

In some exemplary embodiments, the thickness of a filter unit of the color filter layer ranges from about 0.1 to about 2 micrometers.

In some exemplary embodiments, when the color filter layer of the at least one light-transmissive region includes a plurality of blue filter units, the proportion of the total area of the plurality of blue filter units in the at least one light-transmissive region ranges from 10% to 50%.

In some exemplary embodiments, when the color filter layer of the at least one light-transmissive region includes first red filter units, first green filter units, and first blue filter units which are periodically arranged, the proportion of the total area of the first blue filter units in the at least one light-transmissive region ranges from 45% to 60%, the proportion of the total area of the first red filter units in the at least one light-transmissive region ranges from 10% to 25%, and the proportion of the total area of the first green filter units in the at least one light-transmissive region ranges from 18% to 33%.

In some exemplary embodiments, the forming of a color filter layer on the side of the display structure layer away from the flexible substrate may include: forming a black matrix on a side of the display structure layer in the second display region away from the flexible substrate; and synchronously forming a plurality of periodically arranged second filter units that transmit light of different colors, a plurality of periodically arranged first filter units that transmit light of different colors and a plurality of first blue filter units periodically arranged. The plurality of second filter units are located in the second display region, the plurality of first filter units are located in the at least one sub-display region of the first display region, and the plurality of blue filter units are located in the at least one light-transmissive region of the first display region.

In some exemplary embodiments, the forming of a color filter layer on the side of the display structure layer away from the flexible substrate may include: forming a black matrix on a side of the display structure layer in the second display region away from the flexible substrate; synchronously forming a plurality of periodically arranged second filter units that transmit light of different colors, a plurality of periodically arranged first filter units that transmit light of different colors, and a first red filter unit, a first green filter unit and a first blue filter unit periodically arranged; The plurality of second filter units are located in the second display region, the plurality of first filter units are located in the at least one sub-display region of the first display region, and the periodically arranged first red filter unit, first green filter unit and first blue filter unit are located in the at least one light-transmissive region of the first display region.

In some exemplary embodiments, the forming of a display structure layer on a flexible substrate of the first display region and second display region may include synchronously forming a plurality of first light-emitting units and a plurality of second light-emitting units; the plurality of first light-emitting units are located in the at least one sub-display region of the first display region, and the plurality of second light-emitting units are located in the second display region.

The preparation process of the display substrate has been described in detail in the previous embodiments and will not be repeated here.

Figure 19:
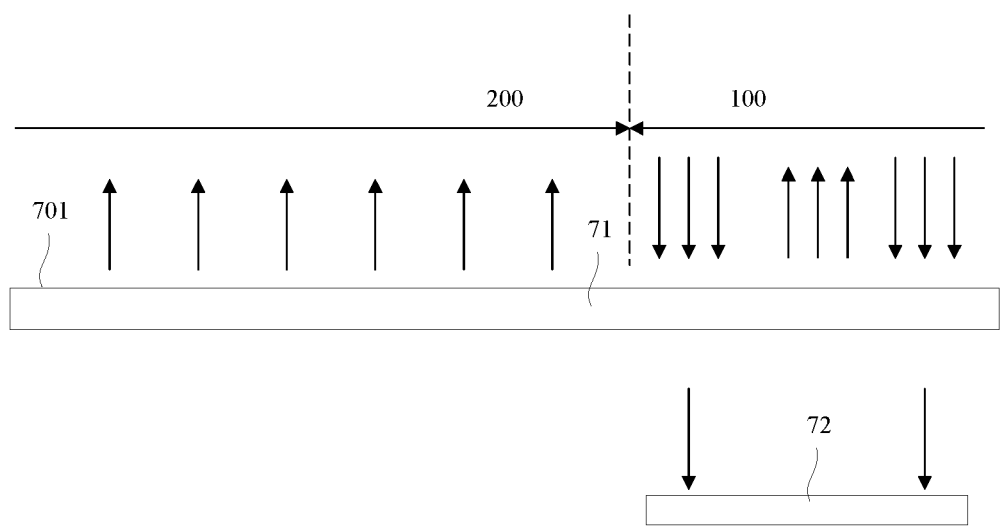
FIG. 19 is a schematic structural diagram of a display apparatus according to at least one embodiment of the present disclosure.

FIG. 19 is a schematic diagram of a structure of a display apparatus according to at least one embodiment of the present disclosure. As shown in FIG. 19, the present embodiment provides a display device including a display substrate 71 and a photosensitive element 72 located on a light exit side 701 of a display structure layer away from the display substrate 71. An orthographic projection of the photosensitive element 72 on the display substrate 71 is overlapped with the first display region 100. In some examples, the second display region 200 is used as a regular display region. Herein, the pixel density of the second display region 200 is greater than the pixel density of the first display region 100. The display substrate 71 is the display substrate provided in the above-mentioned embodiments. The display substrate may be a flexible OLED display substrate. The display apparatus may be any product or component with a display function such as an OLED display, a cell phone, a tablet computer, a television, a display, a laptop, a digital photo frame, a navigator, and so on, which is not limited in the embodiments of the present disclosure.

In the description of embodiments of the present disclosure, orientation or positional relationships indicated by terms "middle", "upper", "lower", "front", "back", "vertical", "horizontal", "top", "bottom", "inside", "outside" and the like are based on the orientation or positional relationships shown in the drawings, and are for the purpose of ease of description of the present disclosure and simplification of the description only, but are not intended to indicate or imply that the referred device or element must have a specific orientation, or be constructed and operated in a particular orientation, and therefore they should not be construed as limitations on the present disclosure.

Although the implementations disclosed in the present disclosure are as above, the described contents are only implementation adopted for convenience of understanding the present disclosure and are not intended to limit the present disclosure. Any skill in the art to which the present disclosure belongs may make any modifications and changes in implementation forms and details without departing from the spirit and scope disclosed in the present disclosure. However, the scope of patent protection of the present disclosure is still subject to the scope defined by the appended claims.

The invention claimed is:

1. A display substrate, comprising:
    a flexible substrate comprising a first display region, wherein the first display region comprises at least one sub-display region and at least one light-transmissive region;
    a display structure layer comprising a plurality of first light-emitting units disposed on the flexible substrate of the at least one sub-display region; and
    a color filter layer arranged on a light exit side of the display structure layer and at least one light-transmissive region;
    wherein the color filter layer of the at least one light-transmissive region comprises a plurality of blue filter units;
    wherein a proportion of the total area of the plurality of blue filter units in the at least one light-transmissive region ranges from 10% to 50%.

2. The display substrate of claim 1, wherein a thickness of a filter unit of the color filter layer ranges from about 0.1 micrometers to about 2 micrometers.

3. The display substrate of claim 2, wherein the flexible substrate further comprises a second display region, and a pixel density of the second display region is greater than a pixel density of the first display region;
    the display structure layer further comprises a plurality of second light-emitting units disposed on the flexible substrate in the second display region;
    a color filter layer of the second display region comprises a plurality of second filter units periodically arranged that transmit light of different colors and a black matrix located between adjacent second filter units; and
    an orthographic projection of the second filter units on the flexible substrate is overlapped with an orthographic projection of the second light-emitting units on the flexible substrate, and a color of light transmitted by the second filter units is the same as a color of light emitted by the second light-emitting units.

4. The display substrate of claim 1, wherein the color filter layer of at least one sub-display region comprises a plurality of periodically arranged first filter units that transmit light of different colors;
    an orthographic projection of the first filter units on the flexible substrate is overlapped with an orthographic projection of the first light-emitting units on the flexible substrate, and a color of light transmitted by the first filter units is the same as a color of light emitted by the first light-emitting units.

5. The display substrate of claim 4, wherein the plurality of first filter units that transmit light of different colors in the at least one sub-display region comprises a red filter unit, a green filter unit, and a blue filter unit;
    an area of each blue filter unit of the at least one light-transmissive region is equal to an area of each blue filter unit of the at least one sub-display region, and an arrangement of the plurality of blue filter units is the same as an arrangement of a plurality of blue filter units in the at least one sub-display region.

6. The display substrate of claim 1, wherein the color filter layer and the display structure layer are disposed on a same side of the flexible substrate; or, the display structure layer is disposed on a side of the flexible substrate, and the color filter layer is disposed on the other side of the flexible substrate.

7. The display substrate of claim 1, wherein the flexible substrate further comprises a second display region, and a pixel density of the second display region is greater than a pixel density of the first display region;
    the display structure layer further comprises a plurality of second light-emitting units disposed on the flexible substrate in the second display region;
    a color filter layer of the second display region comprises a plurality of second filter units periodically arranged that transmit light of different colors and a black matrix located between adjacent second filter units; and
    an orthographic projection of the second filter units on the flexible substrate is overlapped with an orthographic projection of the second light-emitting units on the flexible substrate, and a color of light transmitted by the second filter units is the same as a color of light emitted by the second light-emitting units.

8. A display device, comprising the display substrate of claim 1 and a photosensitive element located on a light exit side of the display structure layer away from the display substrate, wherein an orthographic projection of the photosensitive element on the display substrate is overlapped with the first display region.

9. A method for preparing a display substrate, comprising:
    providing a flexible substrate comprising a first display region, wherein the first display region comprises at least one sub-display region and at least one light-transmissive region;
    forming a display structure layer on the flexible substrate, wherein the display structure layer comprises a plurality of first light-emitting units disposed in the at least one sub-display region;
    forming a color filter layer on a light exit side of the display structure layer and at least one light-transmissive region; wherein the color filter layer of the at least one light-transmissive region comprises a plurality of blue filter units;
    wherein a proportion of the total area of the plurality of blue filter units in the at least one light-transmissive region ranges from 10% to 50%.

10. The preparation method of claim 9, wherein a thickness of a filter unit of the color filter layer ranges from about 0.1 to about 2 micrometers.

11. The preparation method of claim 9, wherein forming the color filter layer on the side of the display structure layer away from the flexible substrate comprises:

forming a black matrix on a side of the display structure layer in a second display region of the flexible substrate away from the flexible substrate;

synchronously forming a plurality of periodically arranged second filter units that transmit light of different colors, a plurality of periodically arranged first filter units that transmit light of different colors, and a plurality of blue filter units, wherein the plurality of second filter units are located in the second display region, the plurality of first filter units are located in the at least one sub-display region of the first display region, and the plurality of blue filter units are located in the at least one light-transmissive region of the first display region.

12. The preparation method of claim 9, wherein forming the display structure layer on the flexible substrate comprises:

synchronously forming a plurality of first light-emitting units and a plurality of second light-emitting units, wherein the plurality of first light-emitting units are located in the at least one sub-display region of the first display region, and the plurality of second light-emitting units are located in a second display region of the flexible substrate.

\* \* \* \* \*